United States Patent
Gu et al.

(10) Patent No.: US 10,332,911 B2
(45) Date of Patent: Jun. 25, 2019

(54) INTEGRATED CIRCUITS (ICS) ON A GLASS SUBSTRATE

(71) Applicant: QUALCOMM Incorporated, San Diego, CA (US)

(72) Inventors: Shiqun Gu, San Diego, CA (US); Daeik Daniel Kim, Del Mar, CA (US); Matthew Michael Nowak, San Diego, CA (US); Jonghae Kim, San Diego, CA (US); Changhan Hobie Yun, San Diego, CA (US); Je-Hsiung Jeffrey Lan, San Diego, CA (US); David Francis Berdy, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/380,800

(22) Filed: Dec. 15, 2016

(65) Prior Publication Data
US 2017/0098663 A1    Apr. 6, 2017

Related U.S. Application Data

(63) Continuation of application No. 14/861,958, filed on Sep. 22, 2015, now Pat. No. 9,768,109.

(51) Int. Cl.
*H01L 21/84* (2006.01)
*H01L 23/66* (2006.01)
(Continued)

(52) U.S. Cl.
CPC ........ *H01L 27/1203* (2013.01); *H01L 21/304* (2013.01); *H01L 21/30604* (2013.01);
(Continued)

(58) Field of Classification Search
CPC ..................... H01L 27/1207; H01L 21/76251
See application file for complete search history.

(56) References Cited

U.S. PATENT DOCUMENTS

| 5,399,231 A | 3/1995 | McCarthy |
| 5,528,054 A * | 6/1996 | Ipposhi ............... H01L 21/2026 257/369 |

(Continued)

FOREIGN PATENT DOCUMENTS

| EP | 1463105 A2 | 9/2004 |
| JP | H09312349 A | 12/1997 |

(Continued)

OTHER PUBLICATIONS

International Search Report and Written Opinion—PCT/US2016/044751—ISA/EPO—dated Jan. 18, 2017.

(Continued)

*Primary Examiner* — Farun Lu
(74) *Attorney, Agent, or Firm* — Qualcomm Incorporated-Toler

(57) ABSTRACT

An integrated circuit (IC) includes a glass substrate and a buried oxide layer. The IC additionally includes a first semiconductor device coupled to the glass substrate. The first semiconductor device includes a first gate and a first portion of a semiconductive layer coupled to the buried oxide layer. The first gate is located between the glass substrate and the first portion of the semiconductive layer and between the glass substrate and the buried oxide layer. The IC additionally includes a second semiconductor device coupled to the glass substrate. The second semiconductor device includes a second gate and a second portion of the semiconductive layer. The second gate is located between
(Continued)

the glass substrate and the second portion of the semiconductive layer. The first portion is discontinuous from the second portion.

9 Claims, 30 Drawing Sheets

(51) Int. Cl.
*H01L 27/12* (2006.01)
*H01L 29/10* (2006.01)
*H01L 29/66* (2006.01)
*H01L 21/304* (2006.01)
*H01L 21/306* (2006.01)
*H01L 21/762* (2006.01)
*H01L 21/768* (2006.01)
*H01L 23/498* (2006.01)
*H01L 23/528* (2006.01)
*H01L 27/088* (2006.01)
*H01L 27/092* (2006.01)
*H01L 21/8234* (2006.01)

(52) U.S. Cl.
CPC .. *H01L 21/76251* (2013.01); *H01L 21/76802* (2013.01); *H01L 21/76877* (2013.01); *H01L 21/76895* (2013.01); *H01L 21/823481* (2013.01); *H01L 21/84* (2013.01); *H01L 23/49894* (2013.01); *H01L 23/528* (2013.01); *H01L 23/66* (2013.01); *H01L 27/088* (2013.01); *H01L 27/092* (2013.01); *H01L 27/1207* (2013.01); *H01L 27/1222* (2013.01); *H01L 27/1248* (2013.01); *H01L 27/1266* (2013.01); *H01L 29/1087* (2013.01); *H01L 27/1255* (2013.01); *H01L 29/66772* (2013.01)

(56) References Cited

U.S. PATENT DOCUMENTS

| | | | |
|---|---|---|---|
| 6,891,236 | B1 | 5/2005 | Yamazaki |
| 7,897,468 | B1* | 3/2011 | Luo ..................... H01L 29/1083 257/E21.421 |
| 8,525,292 | B2 | 9/2013 | Cheng et al. |
| 8,835,232 | B2 | 9/2014 | Jagannathan et al. |
| 2002/0106844 | A1 | 8/2002 | Kotani |
| 2004/0026746 | A1* | 2/2004 | Nakazawa ........ H01L 21/76264 257/374 |
| 2004/0222471 | A1 | 11/2004 | Inoh |
| 2005/0059219 | A1 | 3/2005 | Tayanaka |
| 2006/0172467 | A1 | 8/2006 | Lee et al. |
| 2008/0311726 | A1 | 12/2008 | Ohnuma et al. |
| 2010/0140710 | A1 | 6/2010 | Kuroda |
| 2012/0012972 | A1 | 1/2012 | Takafuji et al. |
| 2012/0299147 | A1 | 11/2012 | Mitani |
| 2013/0120951 | A1* | 5/2013 | Zuo ..................... H01L 27/0688 361/783 |
| 2015/0035072 | A1 | 2/2015 | Dutta et al. |
| 2015/0069571 | A1 | 3/2015 | Gambino et al. |
| 2015/0102412 | A1 | 4/2015 | Morin et al. |
| 2017/0084531 | A1 | 3/2017 | Gu et al. |

FOREIGN PATENT DOCUMENTS

| | | |
|---|---|---|
| JP | H1079511 A | 3/1998 |
| JP | 2001230423 A | 8/2001 |
| JP | 2005175306 A | 6/2005 |
| JP | 2008060313 A | 3/2008 |
| TW | 201244012 A | 11/2012 |
| TW | 201533913 A | 9/2015 |

OTHER PUBLICATIONS

Communication Relating to the Results of the Partial International Search—PCT/US2016/044751—ISA/EPO—dated Oct. 20, 2016.
Taiwan Search Report—TW105125659—TIPO—dated Feb. 23, 2018.
Taiwan Search Report—TW107125079—TIPO—Oct. 2, 2018.

* cited by examiner

INTEGRATED CIRCUITS (ICS) ON A GLASS SUBSTRATE

I. CROSS-REFERENCE TO RELATED APPLICATIONS

The present application claims priority from and is a continuation application of pending U.S. patent application Ser. No. 14/861,958, filed Sep. 22, 2015 and entitled "INTEGRATED CIRCUITS (ICS) ON A GLASS SUBSTRATE," the contents of which are expressly incorporated herein by reference in their entirety.

II. FIELD

The present disclosure is generally related to integrated circuits including glass substrates.

III. DESCRIPTION OF RELATED ART

Advances in technology have resulted in smaller and more powerful computing devices. For example, a variety of portable personal computing devices, including wireless telephones, such as mobile and smart phones, tablets and laptop computers, are small, lightweight, and easily carried by users. Many such devices incorporate functionality, such as a digital still camera, a digital video camera, a digital recorder, and an audio file player. Also, such devices can process executable instructions, including software applications, such as a web browser application, that can be used to access the Internet. As such, these devices can include significant computing capabilities.

These devices may also communicate voice and data packets over wireless networks using radio frequency (RF) transmissions. Accordingly, these devices may include integrated circuits (ICs), such as radio frequency (RF) ICs, which may be formed using a bulk silicon wafer or a silicon on insulator (SOI) wafer. RF ICs formed using a bulk silicon wafer may include channel regions formed in a silicon substrate layer of the bulk silicon wafer. SOI wafers include a layer of silicon formed over a buried oxide layer (e.g., SiO2), which is formed over a silicon substrate layer. During operation of the RF ICs, electric fields from high-frequency signals (e.g., RF signals) may diffuse into the silicon substrate layer of the bulk silicon wafer or the SOI wafer, resulting in signal leakage and inducing electrical non-linearity (e.g., eddy currents) in the substrate layer.

IV. SUMMARY

In a particular aspect, a method of fabricating an IC includes fabricating first and second semiconductor devices. The first semiconductor device includes a first source region and a first drain region connected by semiconductive material of a first portion of a semiconductive layer. The second semiconductor device includes a second source region and a second drain region connected by semiconductive material of a second portion of a semiconductive layer. The method further includes removing portions of the semiconductive layer such that the first portion of the semiconductive layer is discontinuous from the second portion of the semiconductive layer. The method further includes coupling a glass substrate to the first and second semiconductor devices.

In a particular aspect, an IC includes a first semiconductor device on a glass substrate. The first semiconductor device includes a first semiconductive region of a bulk silicon wafer. The IC includes a second semiconductor device on the glass substrate. The second semiconductor device includes a second semiconductive region of the bulk silicon wafer. The IC includes a through substrate trench between the first semiconductive region and the second semiconductive region. The through substrate trench includes a portion disposed beyond a surface of the bulk silicon wafer.

In a particular aspect, a method includes forming a first semiconductor device and a second semiconductor device. The first semiconductor device includes a first semiconductive region in a bulk silicon wafer and the second semiconductor device includes a second semiconductive region in the bulk silicon wafer. The method includes forming a through substrate trench between the first semiconductive region and the second semiconductive region. The through substrate trench includes a portion disposed beyond a surface of the bulk silicon wafer.

One particular advantage provided by at least one of the disclosed aspects, examples, and/or implementations is that physical and electrical separation of the first semiconductive region and the second semiconductive region may enable superior electrical isolation between the first semiconductor device and the second semiconductor device as compared to semiconductor devices that include channel regions formed in shared or contiguous semiconductive regions. Additionally, in contrast to RF ICs formed on a silicon substrate, electric fields associated with RF signals may not induce (or may reduce) transistor load (e.g., eddy current, which may be non-linear) in the glass substrate. Preventing or reducing transistor load associated with the RF signals may reduce RF signal loss and may thereby reduce electrical non-linearity.

Other aspects, advantages, and features of the present disclosure will become apparent after review of the entire application, including the following sections: Brief Description of the Drawings, Detailed Description, and the Claims.

V. BRIEF DESCRIPTION OF THE DRAWINGS

VI. DETAILED DESCRIPTION

Figure 1:
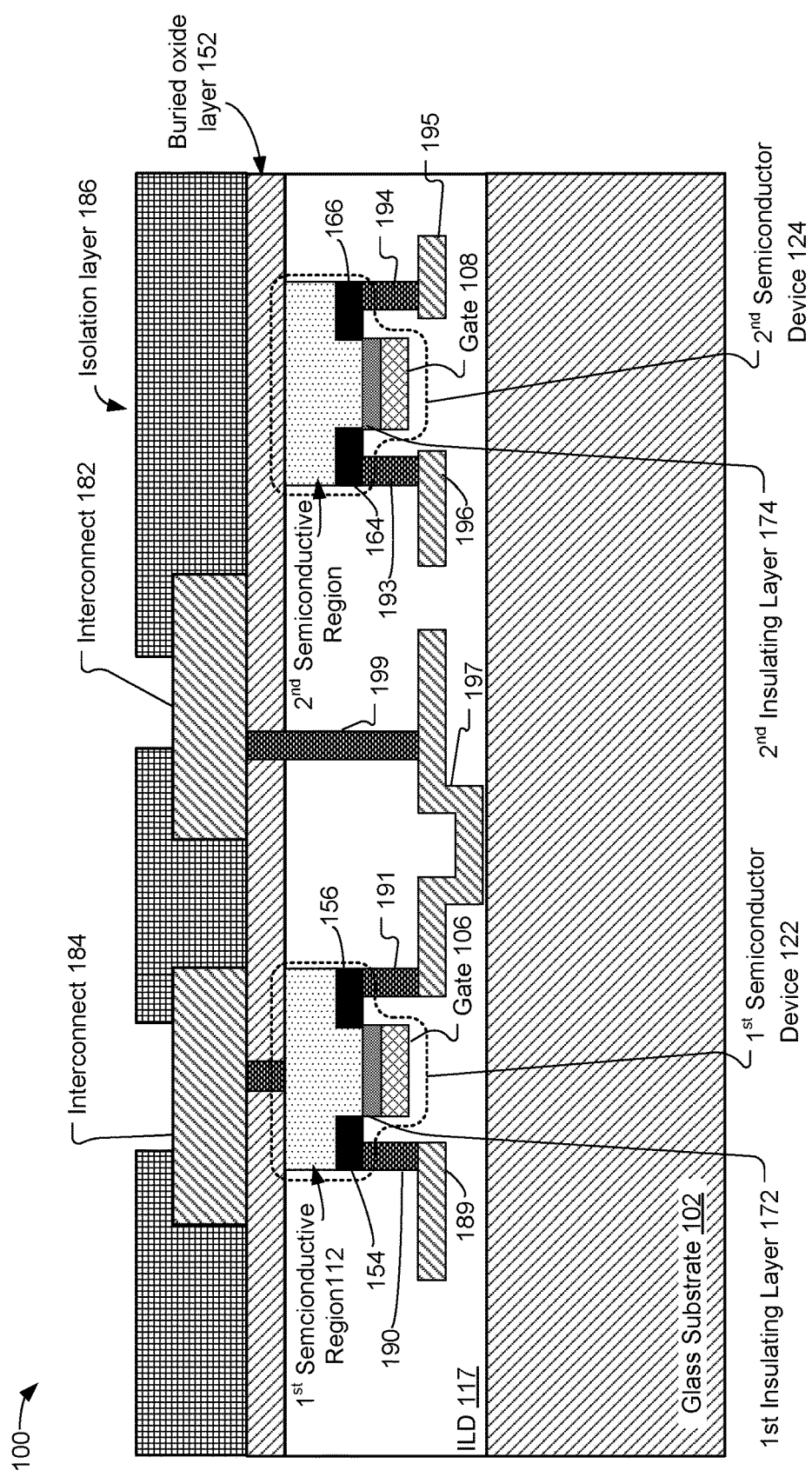
FIG. 1 shows a side view that illustrates an aspect of an integrated circuit (IC) including semiconductor devices disposed on a glass substrate.

FIG. 1 illustrates an example of an integrated circuit (IC) (or a portion of an IC) 100 that includes a first semiconductor device 122 and a second semiconductor device 124 formed using a silicon-on-insulator (SOI) wafer and disposed on a glass substrate 102. The first semiconductor device 122 may be adjacent to the second semiconductor device 124 (e.g., the first and second semiconductor devices 122 and 124 may be neighbor devices). In some examples, the first semiconductor device 122 and the second semiconductor device 124 may correspond to a complementary pair of metal-oxide semiconductor field effect transistors (MOSFETS) of a complementary metal oxide semiconductor (CMOS) device. In some examples, the IC 100 may be configured to operate in a radio frequency (RF) application, e.g., as a portion of an RF component. For example, the IC 100 may be configured to operate as an RF switch. In this example, the IC 100 may include or be coupled to one or more passive devices (e.g., inductors and capacitors) of the RF component.

The first semiconductor device 122 has a source region (e.g., a "first source region" 154) and has a drain region (e.g., a "first drain region" 156). The first source region 154 and the first drain region 156 may be formed in, or may be connected by, a first semiconductive region 112 formed of or including semiconductive material, such as silicon (Si), or germanium (Ge). The second semiconductor device 124 of FIG. 1 has a source region (e.g., a "second source region" 164) and has a drain region (e.g., a "second drain region" 166). The second source region 164 and the second drain region 166 may be formed in, or may be connected by, a second semiconductive region 114 formed of or including semiconductive material, such as Si or Ge.

Figure 5:
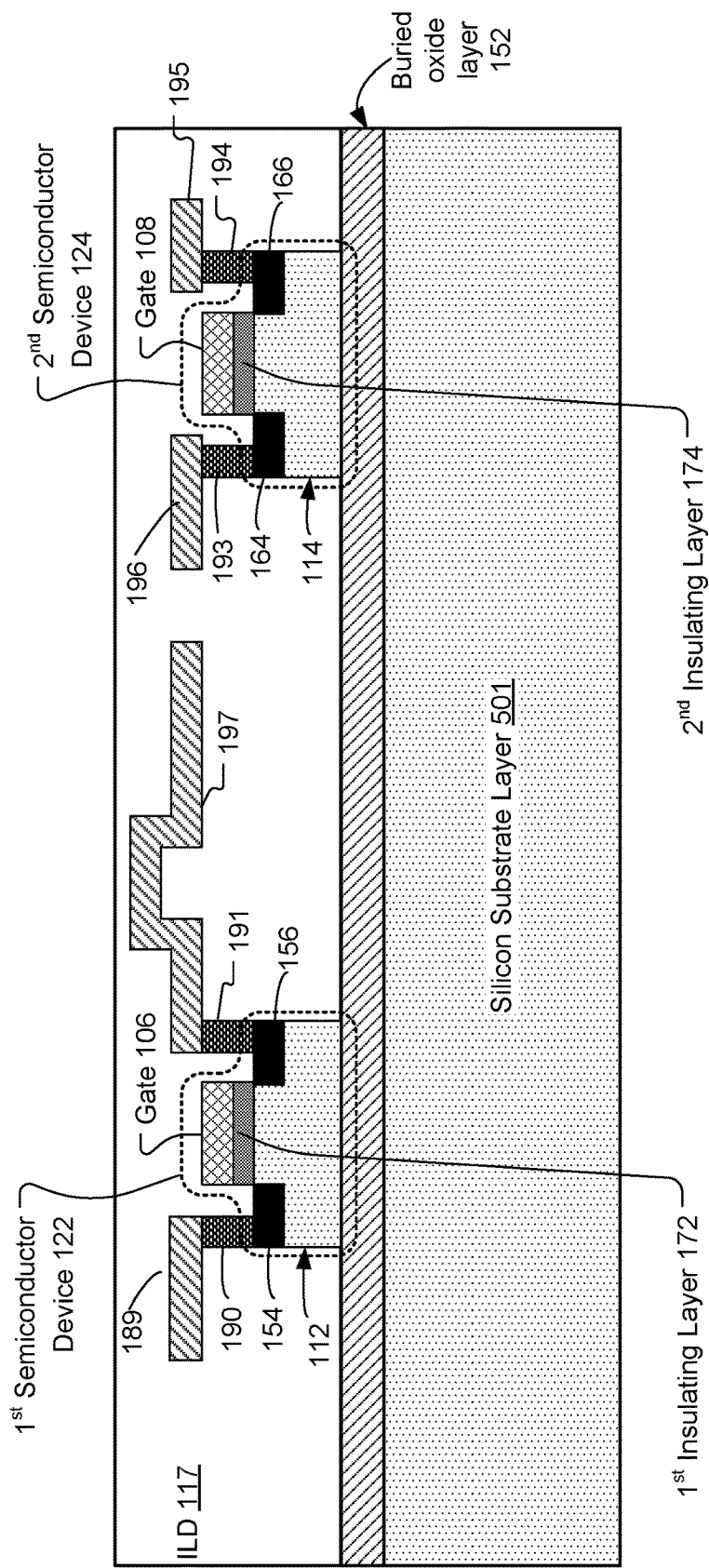
FIG. 5 illustrates an example of a first stage during fabrication of the IC of FIG. 1.

The IC 100 may be formed as described in more detail below with reference to FIGS. 5-9. In some examples, the first semiconductive region 112 may be formed in or may correspond to a first portion of a silicon layer of a SOI wafer, and the second semiconductive region 114 may be formed in or may correspond to a second portion of the silicon layer of the SOI wafer as described in more detail below with reference to FIGS. 5-9. For example, FIG. 5 illustrates an example during a first stage of fabricating the IC 100 of FIG. 1, and the SOI wafer may include a silicon layer on a first side of the buried oxide layer 152 and may include a silicon substrate layer 501 on a second side of the buried oxide layer 152. Portions of the silicon layer on the first side of the buried oxide layer 152 of the SOI wafer that are located between the first and second semiconductive regions 112 and 114 of FIG. 1 may be removed (etched) such that the first and second semiconductive regions 112 and 114 of FIG. 1 are not connected by semiconductive material. Thus, the first semiconductive region 112 may be discontinuous from the second semiconductive region 114.

During operation, a channel of the first semiconductor device 122 may form in the first semiconductive region 112, and a channel of the second semiconductor device 124 may form in the second semiconductive region 114. Thus, channels of the first semiconductor device 122 and the second semiconductor device 124 may form in discontinuous portions of semiconductive material (e.g., silicon) of the silicon layer on the first side of the buried oxide layer 152 of the SOI wafer.

In some examples, a gate (e.g., a "first gate") 106 of the first semiconductor device 122 may be disposed between the glass substrate 102 and the first semiconductive region 112, and a gate (e.g., a "second gate") 108 of the second semiconductor device 124 may be disposed between the glass substrate 102 and the second semiconductive region 114. In some examples, the first semiconductive region 112 and the second semiconductive region 114 are between the glass substrate 102 and the buried oxide layer 152 (of a modified SOI wafer as described in more detail with reference to FIGS. 5-9).

Additionally, the IC 100 of FIG. 1 may include dielectric material (e.g., of an inter-layer dielectric (ILD) 117) between semiconductive material of the first semiconductive region 112 and semiconductive material of the second semiconductive region 114. The dielectric material may electrically isolate the first semiconductive region 112 from the second semiconductive region 114.

The physical and electrical separation of the silicon material of the first semiconductive region 112 and the semiconductive material of the second semiconductive region 114 may enable superior electrical isolation between the first semiconductor device 122 and the second semiconductor device 124 as compared to semiconductor devices that include channel regions formed in shared or contiguous semiconductive regions. Additionally, in contrast to RF ICs formed on a silicon substrate, electric fields associated with RF signals may not induce (or may reduce) transistor load (e.g., eddy current, which may be non-linear) in the glass substrate 102. Preventing or reducing transistor load associated with the RF signals may reduce RF signal loss and may thereby reduce electrical non-linearity.

Figure 2:
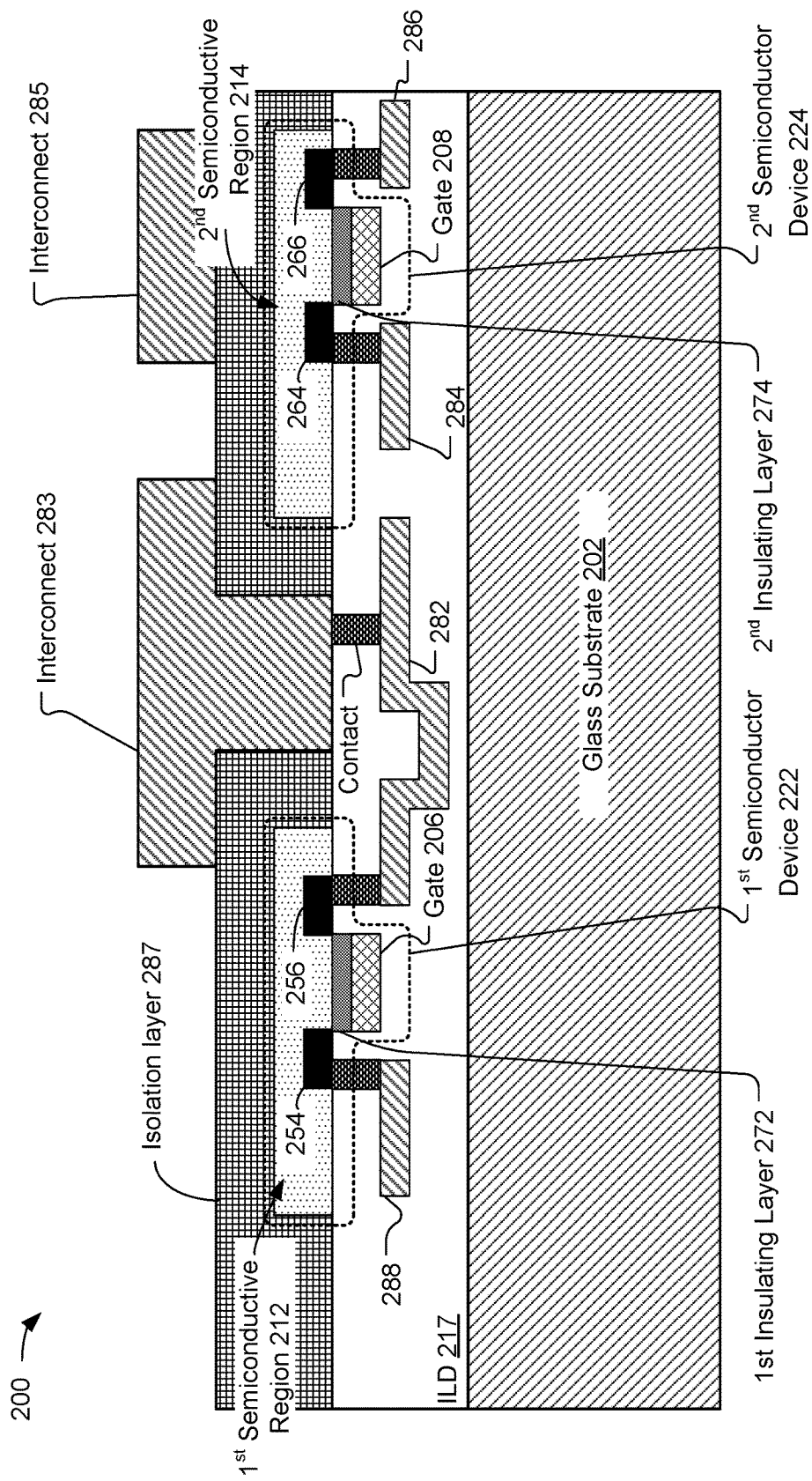
FIG. 2 shows a side view that illustrates an aspect of an IC including semiconductor devices disposed on a glass substrate.

FIG. 2 illustrates an IC (or a portion of an IC) 200 that includes a first semiconductor device 222 and a second semiconductor device 224 formed using a bulk silicon wafer and disposed on a glass substrate 202. The first semiconductor device 222 may be adjacent to the second semiconductor device 224 (e.g., the first and second semiconductor devices 222 and 224 may be neighbor devices). In some examples, the first semiconductor device 222 and the second semiconductor device 224 may correspond to a complementary pair of MOSFETS of a CMOS device. In some examples, the IC 200 may be configured to operate in an RF application. For example, the IC 200 may be configured to operate as an RF switch.

The first semiconductor device 222 has a source region (e.g., a "first source region" 254) and has a drain region (e.g., a "first drain region" 256). The first source region 254 and the first drain region 256 may be formed in, or may be connected by, a first semiconductive region 212 formed of or including semiconductive material, such as silicon. The second semiconductor device 224 has a source region (e.g., a "second source region" 264) and a drain region (e.g., a "second drain region" 266). The second source region 264 and the second drain region 266 may be formed in, or may be connected by, a second semiconductive region 214 formed of or including semiconductive material, such as silicon.

Figure 10:
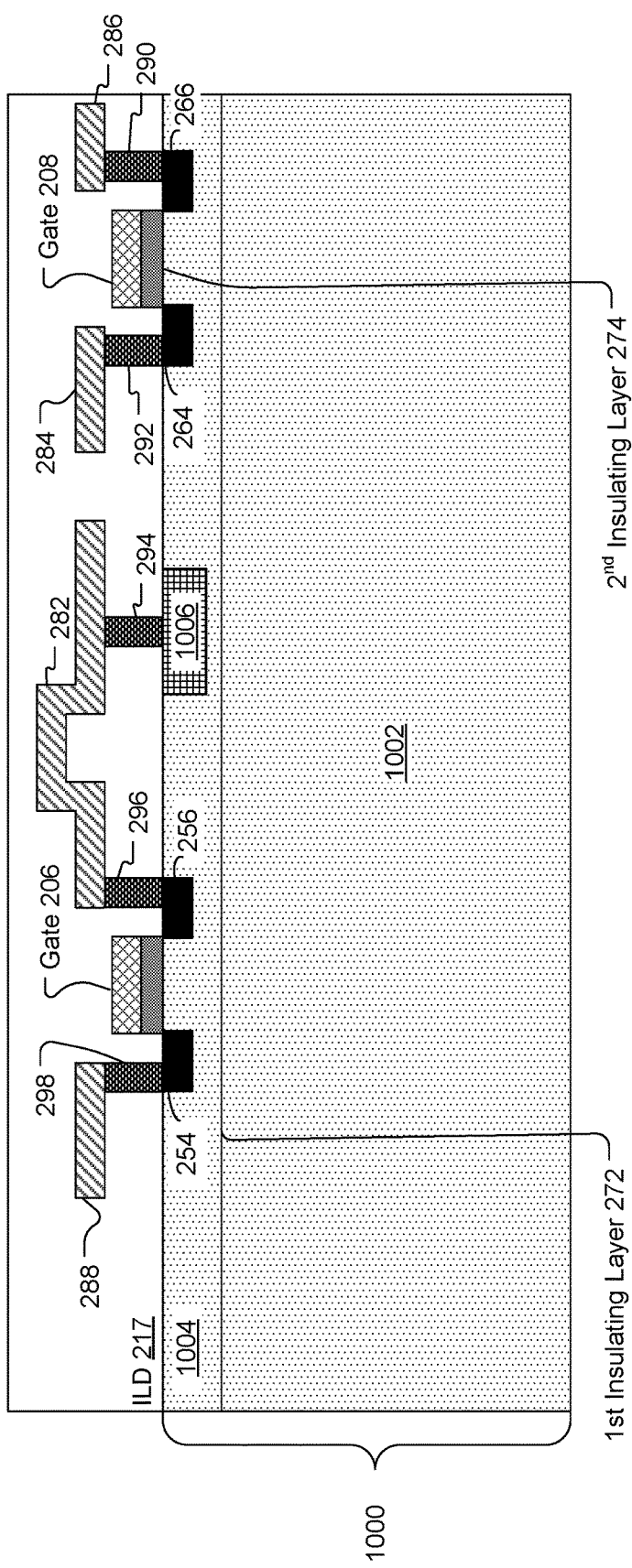
FIG. 10 illustrates an example of a first stage during fabrication of the IC of FIG. 2.

The IC 200 may be formed as described in more detail below with reference to FIGS. 10-13. In some examples, the first semiconductive region 212 of FIG. 2 may be formed in or may correspond to a first portion of a silicon wafer, such as a bulk silicon wafer (e.g., a bulk silicon epitaxial wafer), and the second semiconductive region 214 may be formed in or may correspond to a second portion of the bulk silicon wafer. For example, FIG. 10 illustrates a bulk silicon wafer 1000 (e.g., a bulk silicon epitaxial wafer) including a bulk silicon layer (e.g., a heavily doped bulk silicon wafer) 1002 and an epitaxial layer 1004. In this example, the first and second semiconductive regions 212 and 214 of FIG. 2 may be formed in or may correspond to first and second portions of the epitaxial layer 1004 of FIG. 10. For example, portions of the bulk silicon wafer 1000 (e.g., portions of the epitaxial layer 1004) between the first and second semiconductive regions 212 and 214 of FIG. 2 may be removed (etched) such that the first semiconductive region 212 and the second semiconductive region 214 are not connected by semiconductive material. Thus, the first semiconductive region 212 may be discontinuous from the second semiconductive region 214, and channels of the first semiconductor device 222 and the second semiconductor device 224 may form in discontinuous portions of semiconductive material of the patterned (etched) bulk silicon wafer.

During operation, a channel of the first semiconductor device 222 may form in the first semiconductive region 212, and a channel of the second semiconductor device 224 may form in the second semiconductive region 214. Thus, channels of the first semiconductor device 222 and the second semiconductor device 224 may form in discontinuous portions of semiconductive material of the bulk silicon wafer 1000 of FIG. 10.

In some examples, a gate (e.g., a "first gate") 206 of the first semiconductor device 222 may be disposed between the glass substrate 202 and the first semiconductive region 212, and a gate (e.g., a "second gate") 208 of the second semiconductor device 224 may be disposed between the glass substrate 202 and the second semiconductive region 214.

Additionally, the IC 200 may include dielectric material (e.g., of an ILD 217 and/or an isolation layer 287) between silicon material of the first semiconductive region 212 and silicon material of the second semiconductive region 214. The dielectric material may electrically isolate the first semiconductive region 212 from the second semiconductive region 214.

The physical and electrical separation of the semiconductive material of the first semiconductive region 212 and the semiconductive material of the second semiconductive region 214 may enable superior electrical isolation between the first semiconductor device 222 and the second semiconductor device 224 as compared to semiconductor devices that include channel regions formed in shared or contiguous semiconductive regions. Additionally, in contrast to RF ICs formed on a silicon substrate, electric fields associated with RF signals may not induce (or may reduce) transistor load (e.g., eddy current) in the glass substrate 202. Preventing or reducing transistor load associated with the RF signals may reduce RF signal loss or leakage and may reduce electrical non-linearity.

Figure 3:
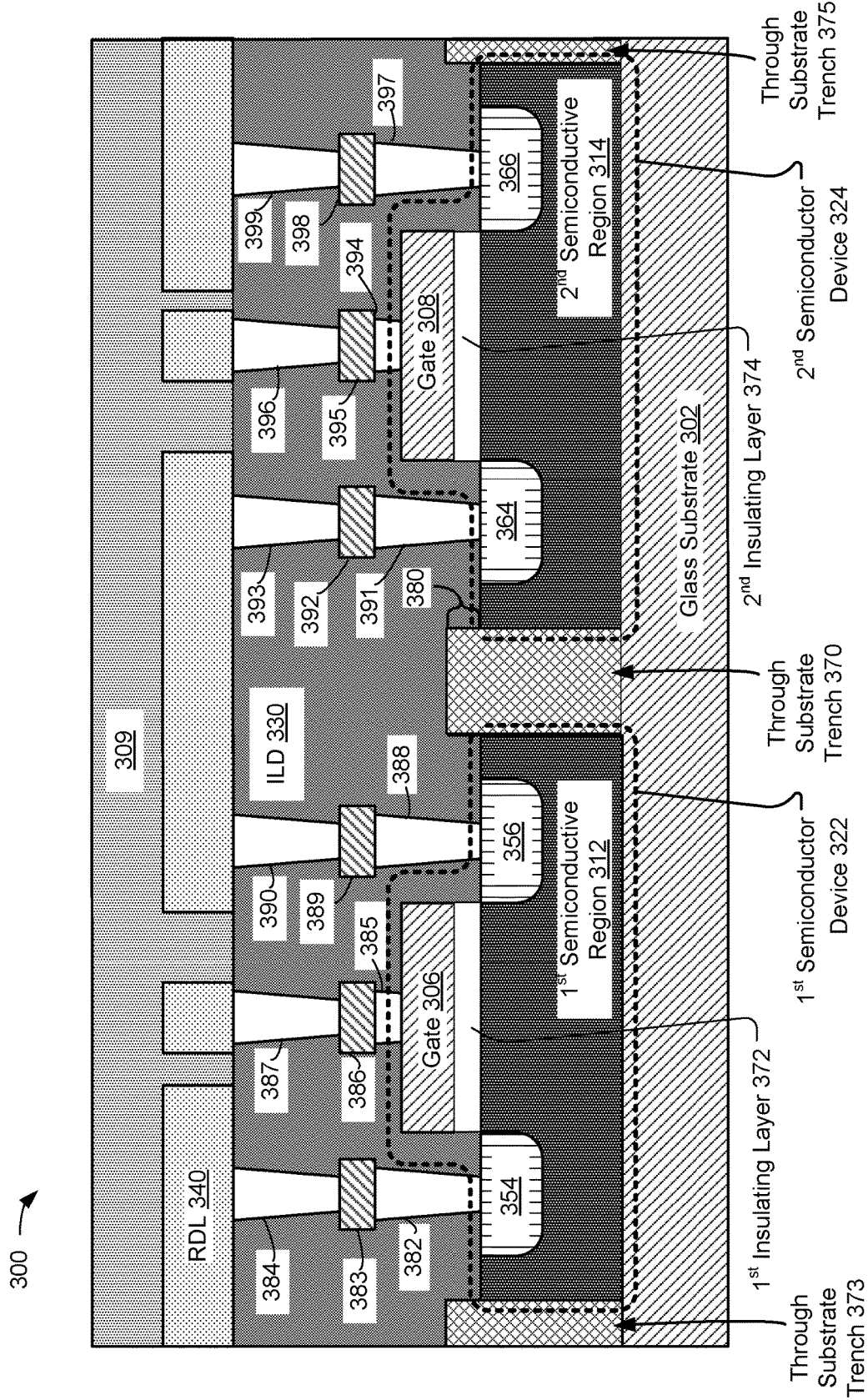
FIG. 3 shows a side view that illustrates an aspect of an IC including semiconductor devices disposed on a glass substrate.

FIG. 3 illustrates an IC (or a portion of an IC) 300 that includes a first semiconductor device 322 and a second semiconductor device 324 formed using a silicon wafer (and disposed on a glass substrate 302). The first semiconductor device 322 may be adjacent to the second semiconductor device 324 (e.g., the first and second semiconductor devices 322 and 324 may be neighbor devices). In some examples, the first semiconductor device 322 and the second semiconductor device 324 may correspond to a complementary pair of MOSFETS of a CMOS device. In some examples, the IC 300 may be configured to operate in an RF application. For example, the IC 300 may be configured to operate as an RF switch.

The first semiconductor device 322 has a source region (e.g., a "first source region" 354) and has a drain region (e.g., a "first drain region" 356). The first source region 354 and the first drain region 356 may be formed in, or may be connected by, a first semiconductive region 312 formed of or including semiconductive material, such as silicon. The first semiconductive region 312 may correspond to a first portion of a bulk silicon wafer as described below in more detail with reference to FIGS. 14-19. The second semiconductor device 324 has a source region (e.g., a "second source region" 364) and has a drain region (e.g., a "second drain region" 366). The second source region 364 and the second drain region 366 may be formed in, or may be connected by, a second semiconductive region 314 formed of or including semiconductive material, such as silicon. The second semiconductive region 314 may correspond to a second portion of the bulk silicon wafer. During operation, a channel of the first semiconductor device 322 may form in the first semiconductive region 312, and a channel of the second semiconductor device 324 may form in the second semiconductive region 314.

The IC 300 may include a through substrate trench 370 between the first semiconductive region 312 and the second semiconductive region 314. The through substrate trench 370 may be formed as described in more detail below with reference to FIGS. 14-19. The through substrate trench 370 may include a portion disposed beyond a surface of the bulk silicon wafer. In some examples, the through substrate trench 370 is filled with dielectric material, such as a material that includes oxide. The portion of the through substrate trench 370 disposed beyond the surface of the bulk silicon wafer may be disposed in an inter-layer dielectric (ILD) 330. For example, FIGS. 14-19 illustrate examples of particular stages during formation of the IC 300 of FIG. 3. The bulk silicon wafer may correspond to the bulk silicon wafer 1000 of FIG. 14 or to a thinned bulk silicon wafer 1602 of FIG. 16, and the surface may correspond to surface 1604 of FIG. 16. In this example, the through substrate trench 370 of FIG. 3 may include a portion 380 disposed beyond the surface 1604 of FIG. 16 (e.g., into the ILD 330). In this example, the through substrate trench 370 of FIG. 3 may extend through an entire thickness of the thinned bulk silicon wafer 1602 of FIG. 16 and beyond the surface 1604 of the thinned bulk silicon wafer 1602 into the ILD 330. Thus, the first semiconductive region 312 of FIG. 3 may be discontinuous from the second semiconductive region 314, and the through substrate trench 370 may electrically isolate the first semiconductive region 312 from the second semiconductive region 314.

The physical and electrical separation of the semiconductive material of the first semiconductive region 312 and the semiconductive material of the second semiconductive region 314 may enable superior electrical isolation between the first semiconductor device 322 and the second semiconductor device 324 as compared to semiconductor devices that include channel regions formed in shared or contiguous semiconductive regions. Additionally, in contrast to RF ICs formed on a silicon substrate, electric fields associated with RF signals may not induce (or may reduce) transistor load (e.g., eddy current) in the glass substrate 302. Preventing or reducing transistor load associated with the RF signals may reduce RF signal loss or leakage and may reduce electrical non-linearity. Additionally, the through substrate trench 370 extending beyond the silicon wafer (e.g., into the inter-layer dielectric layer) may provide superior capacitive isolation as compared to through substrate trenches that do not extend beyond the silicon wafer.

Figure 4:
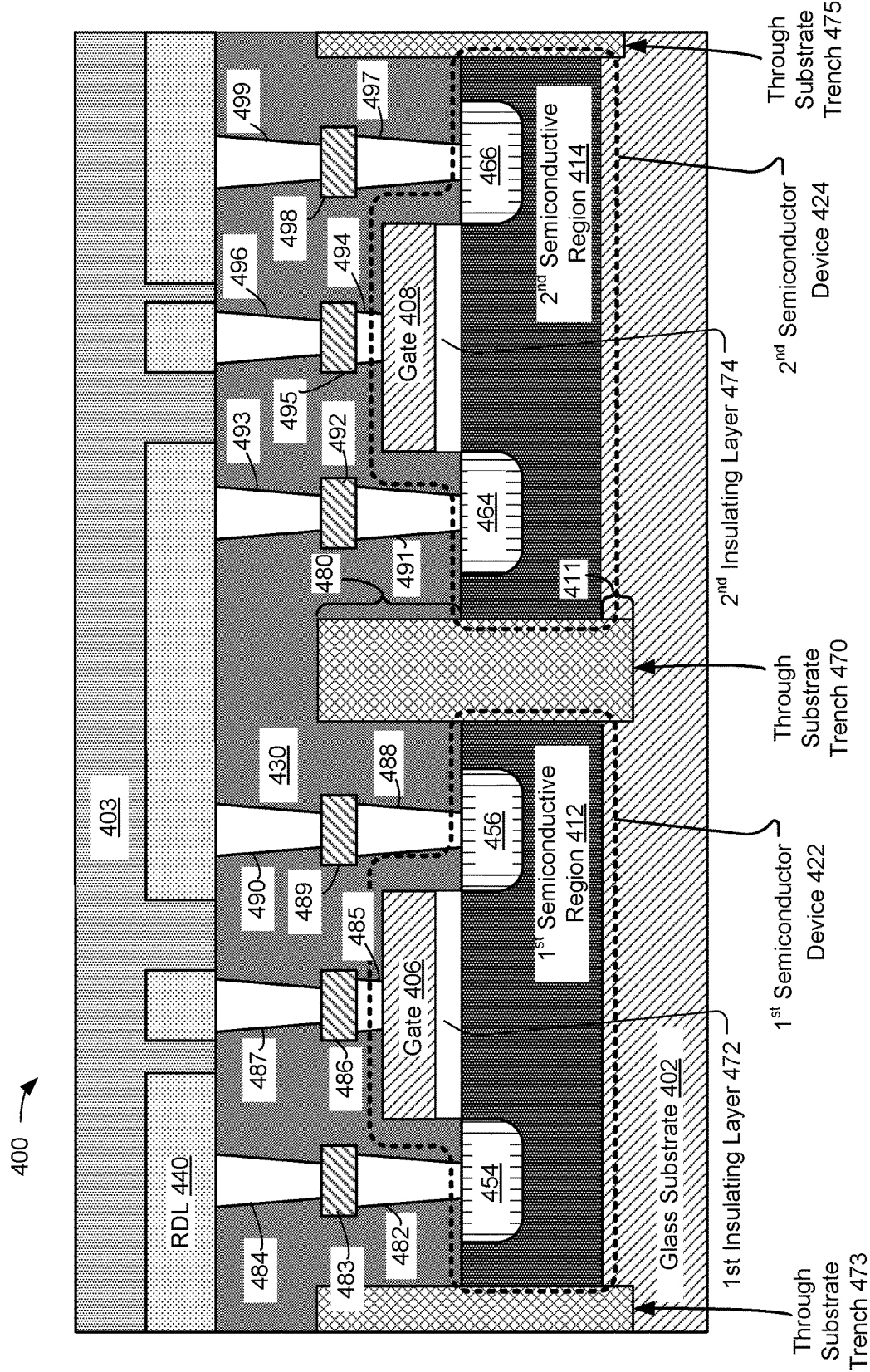
FIG. 4 shows a side view that illustrates an aspect of an IC including semiconductor devices disposed on a glass substrate.

FIG. 4 illustrates an IC (or a portion of an IC) 400 that includes a first semiconductor device 422 and a second semiconductor device 424 formed using a bulk silicon wafer and disposed on a glass substrate 402. The first semiconductor device 422 may be adjacent to the second semiconductor device 424 (e.g., the first and second semiconductor devices 422 and 424 may be neighbor devices). In some examples, the first semiconductor device 422 and the second semiconductor device 424 may correspond to a complementary pair of MOSFETS of a CMOS device. In some examples, the IC 400 may be configured to operate in an RF application. For example, the IC 400 may be configured to operate as an RF switch.

The first semiconductor device 422 has a source region (e.g., a "first source region" 454) and has a drain region (e.g., a "first drain region" 456). The first source region 454 and the first drain region 456 may be formed in, or may be connected by, a first semiconductive region 412 formed of or including semiconductive material, such as silicon. The first semiconductive region 412 may correspond to a first portion of a bulk silicon wafer as described below in more detail with reference to FIGS. 20-25. The second semiconductor device 424 has a source region (e.g., a "second source region" 464) and a drain region (e.g., a "second drain region" 466). The second source region 464 and the second drain region 466 may be formed in, or may be connected by, a second semiconductive region 414 formed of or including semiconductive material, such as silicon. The second semiconductive region 414 may correspond to a second portion of the bulk silicon wafer. During operation, a channel of the first semiconductor device 422 may form in the first semiconductive region 412, and a channel of the second semiconductor device 424 may form in the second semiconductive region 414.

The IC 400 may include a through substrate trench 470 between the first semiconductive region 412 and the second semiconductive region 414. The through substrate trench 470 may be formed as described in more detail below with reference to FIGS. 20-25. The through substrate trench 470 may include portions disposed beyond one or more surfaces of the bulk silicon wafer. In some examples, the through substrate trench 470 is filled with dielectric material, such as a material that includes oxide. For example, FIGS. 20-25 illustrate examples of particular stages during formation of the IC 400 of FIG. 4. The bulk silicon wafer may correspond to the bulk silicon wafer 1000 of FIG. 20 or to a thinned bulk silicon wafer 2202 of FIG. 22, and the one or more surfaces may correspond to surfaces 2206 and 2207. In this example, the through substrate trench 470 of FIG. 4 includes a portion 480 disposed beyond the surface 2207 of FIG. 22 (e.g., into and ILD 430) and a portion 411 of FIG. 4 disposed beyond the surface 2206 of FIG. 22 (e.g., into the glass substrate 402). Thus, the first semiconductive region 412 of FIG. 4 may be discontinuous from the second semiconductive region 414, and the through substrate trench 470 may electrically isolate the first semiconductive region 412 from the second semiconductive region 414.

The physical and electrical separation of the semiconductive material of the first semiconductive region 412 and the semiconductive material of the second semiconductive region 414 may enable superior electrical isolation between the first semiconductor device 422 and the second semiconductor device 424 as compared to semiconductor devices that include channel regions formed in shared or contiguous semiconductive regions. Additionally, in contrast to RF ICs formed on a silicon substrate, electric fields associated with RF signals may not induce (or may reduce) transistor load (e.g., eddy current) in the glass substrate 402. Preventing or reducing transistor load associated with the RF signals may reduce RF signal loss or leakage and may reduce electrical non-linearity. Additionally, the through substrate trench 470 extending beyond the silicon wafer (e.g., into the inter-layer dielectric layer and into the glass substrate) may provide superior capacitive isolation as compared to through substrate trenches that do not extend beyond the silicon wafer.

FIG. 5 illustrates an example of a first stage during fabrication of the IC 100 of FIG. 1. The first stage of FIG. 5 may include fabricating the first semiconductor device 122 and the second semiconductor device 124 using an SOI wafer, fabricating metallization (e.g., contacts and interconnects), forming an inter-layer dielectric layer, and performing a chemical mechanical planarization. The SOI wafer may include the silicon layer on the first side of the buried oxide layer 152 and the silicon substrate layer 501 on the second side of the buried oxide layer 152 as described above with reference to FIG. 1.

A first oxide layer [not illustrated] may be formed on the silicon layer on the first side of the buried oxide layer 152 of the SOI wafer. In some examples, the first oxide layer may be formed using a wet oxidation technique. The first oxide layer may be etched, exposing first and second regions of the silicon layer on the first side of the buried oxide layer 152 of the SOI wafer. The exposed first and second regions of the silicon layer on the first side of the buried oxide layer 152 of the SOI wafer may correspond to locations of the first and second semiconductive regions 112 and 114 of FIG. 1, respectively. A thin layer of insulating material, such as $SiO_2$, may be grown over the surface of the etched first oxide layer and the exposed first and second regions of the silicon layer on the first side of the buried oxide layer 152 of the SOI wafer. A gate material layer may be formed over the insulating material. For example, the gate material layer may include or may be formed of metal or polysilicon and may be deposited using a chemical vapor deposition (CVD)

technique. The gate material layer may be patterned to form the first gate 106 and the second gate 108 of FIG. 1. For example, the gate material layer may be patterned using a photolithographic process. Exposed portions of the thin layer of insulating material may be removed, leaving the first insulating layer 172 and the second insulating layer 174. The exposed portions of the thin layer of insulating material may be removed using an etching process. A diffusion process may be performed on the exposed portions of the first and second regions of the silicon layer of the SOI wafer, thereby forming the first source region 154, the first drain region 156, the second source region 164, and the second drain region 166 of FIG. 1.

Portions of the silicon layer on the first side of the buried oxide layer 152 of the SOI wafer may be removed (e.g., using an etch process), leaving a first island of the silicon layer on the first side of the buried oxide layer 152 of the SOI wafer and a second island of the silicon layer on the first side of the buried oxide layer 152 of the SOI wafer. The first island may correspond to the first semiconductive region 112 of FIG. 1, and the second island may correspond to the second semiconductive region 114.

Additionally, metallization components, such as contacts and interconnects, associated with the first and second semiconductor devices 122 and 124 of FIG. 1 may be formed. For example, a contact 190 may be formed to contact the first source region 154, and a contact 191 may be formed to contact the first drain region 156. As another example, a contact 193 may be formed to contact the second source region 164, and a contact 194 may be formed to contact the second drain region 166. Additionally, interconnects 189, 195, 196, and/or 197 may be formed. Although two levels of interconnects are illustrated in FIG. 1, the IC 100 may include more than two levels of interconnects or fewer than two levels of interconnects.

Additionally, the ILD 117 may be formed by depositing dielectric material. Portions of dielectric material of the ILD 117 between the first and second semiconductor devices 122 and 124 may electrically isolate the first semiconductive region 112 from the second semiconductive region 114. Additionally, the ILD 117 may be planarized by performing chemical-mechanical polishing (CMP).

Figure 6:
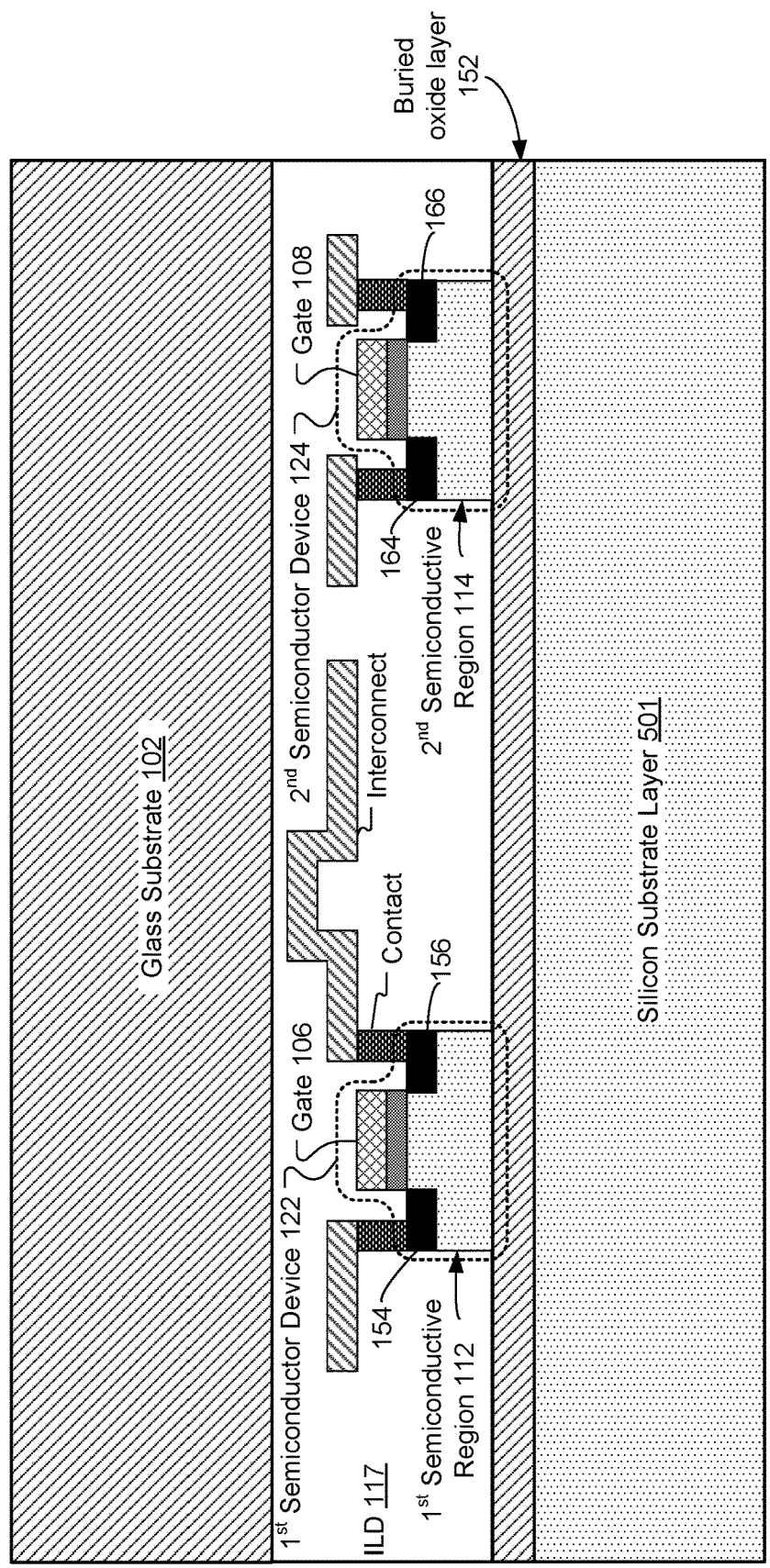
FIG. 6 illustrates an example of a second stage during fabrication of the IC of FIG. 1.

FIG. 6 illustrates an example of a second stage during fabrication of the IC 100 of FIG. 1. The second stage of FIG. 6 may include coupling the glass substrate 102 to the first and second semiconductor devices 122 and 124. For example, the ILD 117 may be formed of material including oxide, and the glass substrate 102 may be bonded to the ILD 117 using a molecular, fusion, or direct bonding technique, such as oxide-to-oxide bonding.

Figure 7:
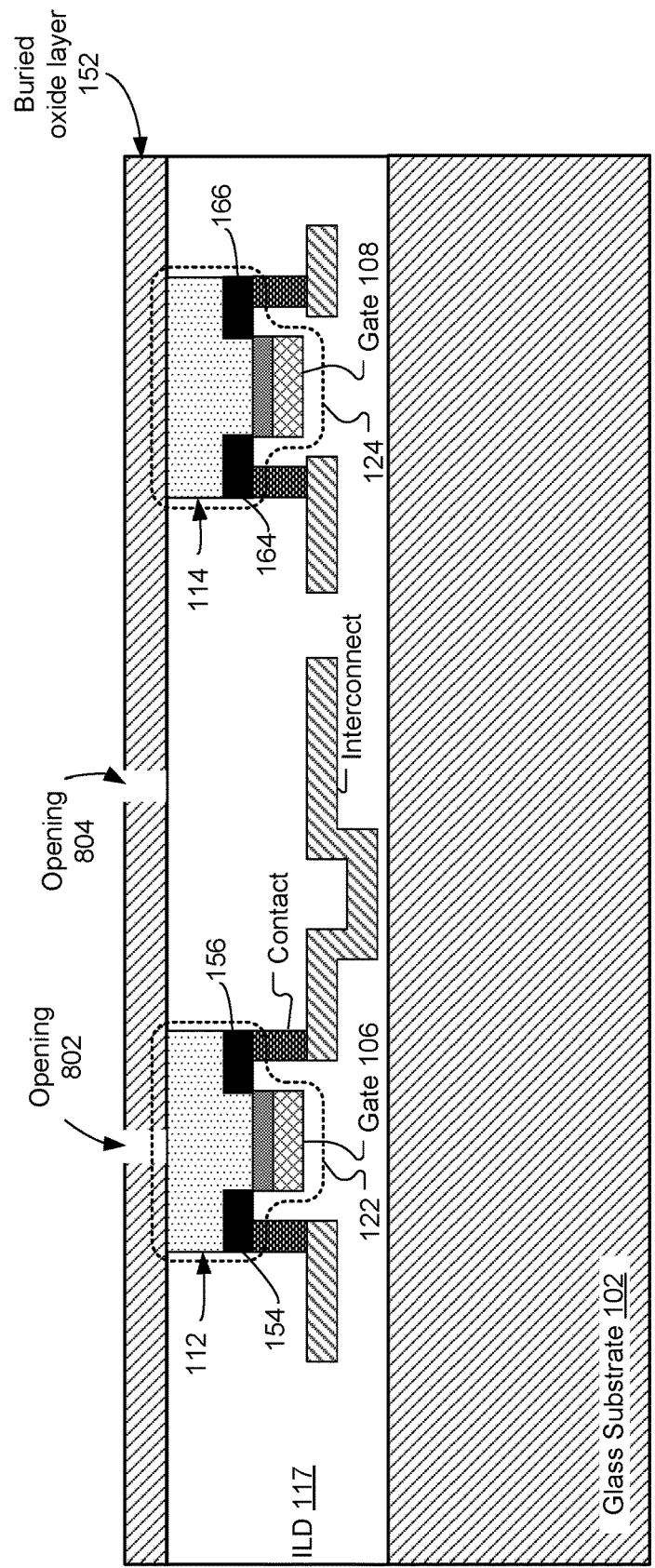
FIG. 7 illustrates an example of a third stage during fabrication of the IC of FIG. 1.

FIG. 7 illustrates an example of a third stage during fabrication of the IC 100 of FIG. 1. The third stage of FIG. 7 may include removing the silicon substrate layer 501 of FIG. 6 and etching openings in the buried oxide layer 152 of the SOI wafer. The silicon substrate layer 501 of FIG. 6 may be removed by grinding the silicon substrate layer 501 down, performing a wet etch, or both. Thus, the silicon substrate layer 501 of the SOI wafer may be removed.

Removing the silicon substrate layer 501 of the SOI wafer may expose the second side of the buried oxide layer 152 of the SOI wafer. The one or more openings etched into the buried oxide layer 152 during the third stage of FIG. 7 may include a first opening 802 and a second opening 804. The first opening 802 and the second opening 804 may be formed using an etching process. The first opening 802 may expose a portion of the first semiconductive region 112.

Figure 8:
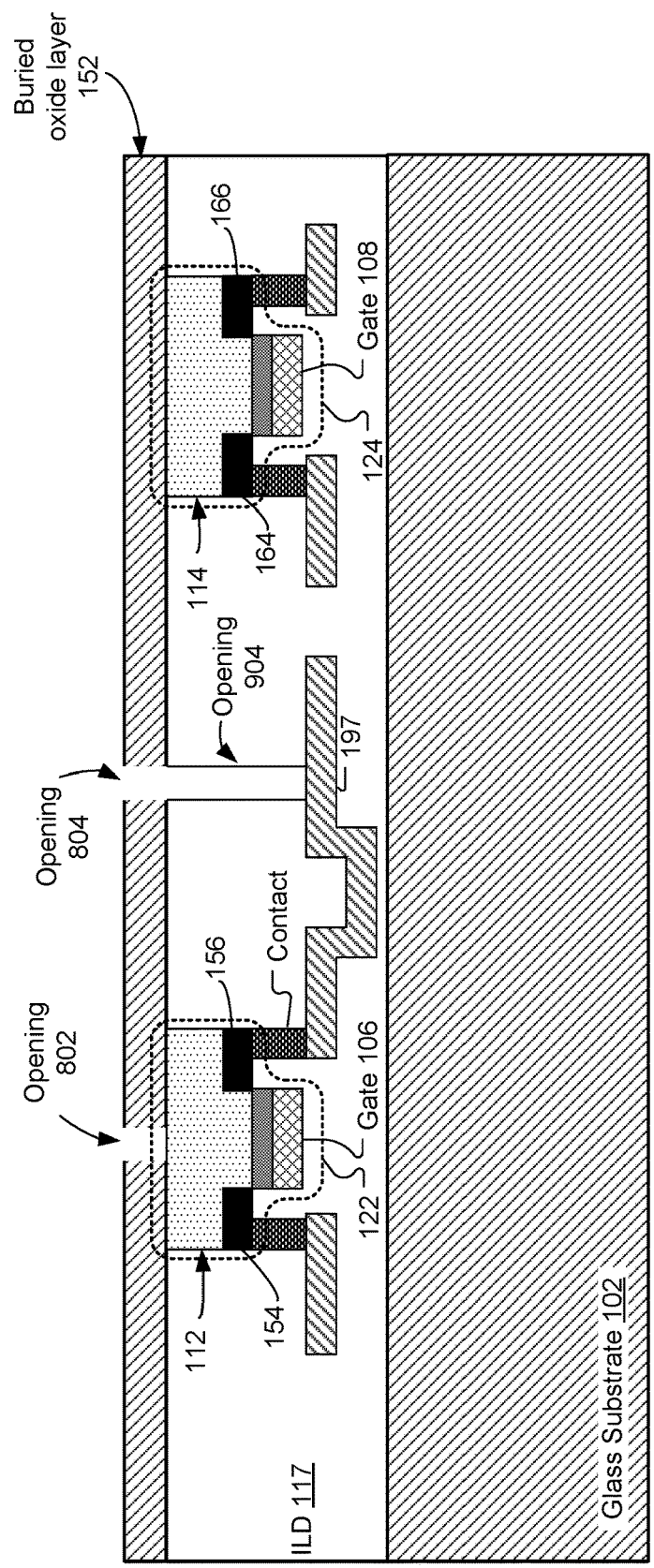
FIG. 8 illustrates an example of a fourth stage during fabrication of the IC of FIG. 1.

FIG. 8 illustrates an example of a fourth stage during fabrication of the IC 100 of FIG. 1. The fourth stage of FIG. 8 may include forming one or more openings 904 in the ILD 117. In some examples, the one or more openings 904 may be formed using an etching process. The one or more openings 904 may expose an interconnect, such as the interconnect 197.

Figure 9:
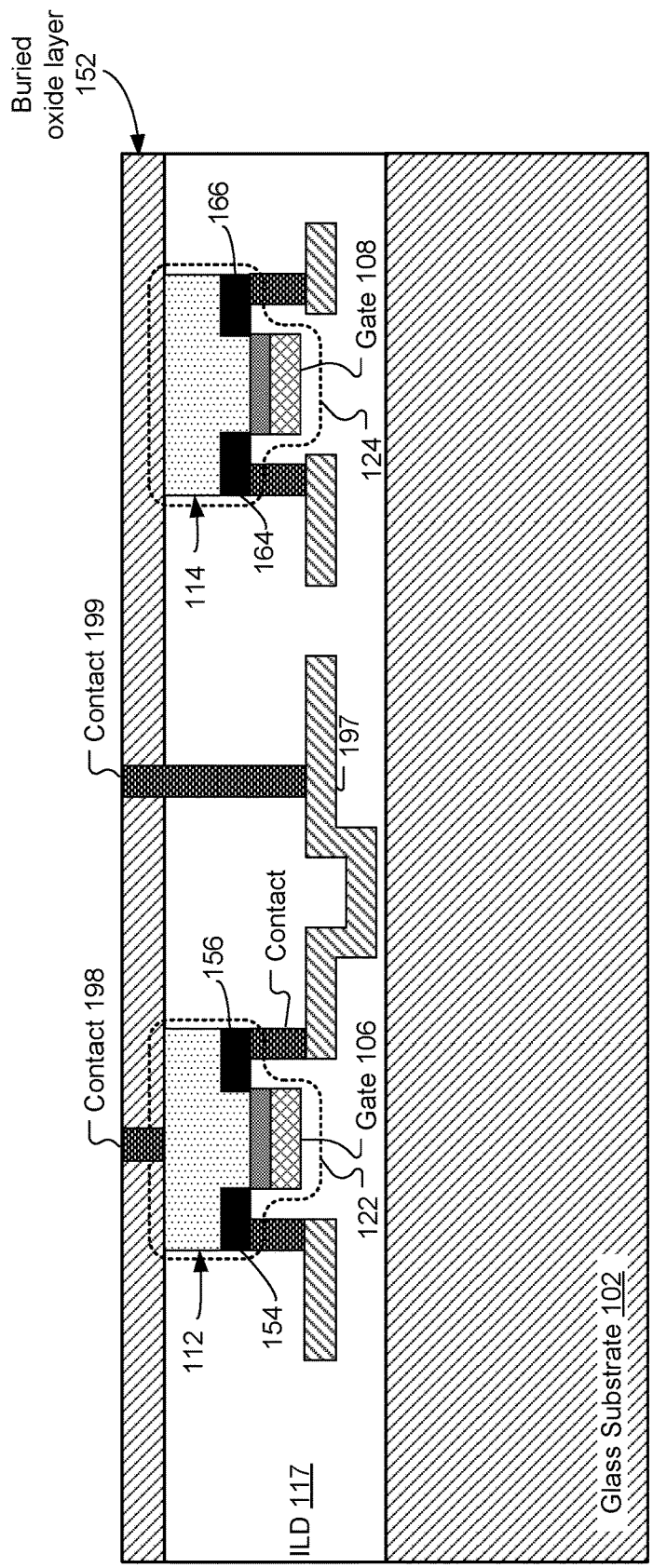
FIG. 9 illustrates an example of a fifth stage during fabrication of the IC of FIG. 1.

FIG. 9 illustrates an example of a fifth stage during fabrication of the IC 100 of FIG. 1. The fifth stage of FIG. 9 may include forming contacts. For example, the fifth stage of FIG. 9 may include forming contacts 198 and 199 by depositing conductive material into the first opening 802 of FIG. 8 and into the opening corresponding to the openings 804 and 904. In some examples, the conductive material may include or be formed of tungsten or aluminum. In some examples, the conductive material may be deposited using a CVD process. The fifth stage of FIG. 9 may further include performing a CMP process to remove any residual conductive material on the buried oxide layer 152 and to planarize the surface (of the second side) of the buried oxide layer 152.

Referring to FIG. 1, an example of a sixth stage during fabrication of the IC 100 is illustrated. The sixth stage may be performed after the fifth stage of FIG. 10. The sixth stage may include forming additional interconnects or passive devices, such as inductors. For examples, interconnects 182 and 184 may be formed. The interconnects 182 and 184 may be formed of or include copper or aluminum. The interconnects 182 and 184 may be electrically isolated from each other by an isolation layer 186. The interconnects 182 and 184 and the isolation layer 186 may be formed using a semi-additive process (SAP).

FIGS. 10-13 (in conjunction with FIG. 2) illustrate examples of stages during fabrication of an IC including a first semiconductor device and a second semiconductor device formed using a silicon wafer (e.g., the bulk silicon wafer 1000 of FIG. 10) and disposed on a glass substrate. For example, the illustrative stages of FIGS. 10-13 (which may each include multiple steps or processes) may be used to fabricate the IC 200 of FIG. 2.

FIG. 10 may illustrate an example of a first stage during fabrication of the IC 200 of FIG. 2. The bulk silicon wafer 1000 may be or may include an epitaxial wafer. For example, the bulk silicon wafer 1000 may include the bulk silicon layer 1002 and the epitaxial layer 1004 (e.g., a thin, moderately to lightly doped epitaxial silicon layer) formed (e.g., grown) on the surface of the bulk silicon layer 1002. The first stage of FIG. 12 may include fabricating the first semiconductor device 222 and the second semiconductor device 224 of FIG. 2, fabricating metallization (e.g., contacts and interconnects), forming an inter-layer dielectric layer, and performing a chemical mechanical planarization.

For example, a shallow trench isolation (STI) region 1006 (e.g., an oxide region) may be formed in the epitaxial layer 1004. Additionally, an etch stop layer (not shown), such as a SiN layer, may be formed over the STI region 1006 (e.g., between the STI region 1006 and the ILD 217). Further, a first oxide layer [not illustrated] may be formed on the epitaxial layer 1004. In some examples, the first oxide layer may be formed using a wet oxidation technique. The first oxide layer may be etched, exposing first and second regions of the epitaxial layer 1004. The exposed first and second regions of the epitaxial layer 1004 may correspond to the first semiconductive region 212 and the second semiconductive region 214 of FIG. 2, respectively. A thin layer of insulating material, such as $SiO_2$, may be grown over the surface of the etched first oxide layer and the exposed first and second regions of the epitaxial layer 1004 of FIG. 10. A gate material layer may be formed over the insulating material. For example, the gate material layer may include or be formed of metal or polysilicon and may be deposited using a CVD technique. The gate material layer may be patterned to form the first gate 206 and the second gate 208. For example, the gate material layer may be patterned using a photolithographic process. Exposed portions of the thin layer of insulating material (e.g., portions of the thin layer of insulating material that are not covered by the first and second gates 206 and 208) may be removed, leaving the first insulating layer 272 and the second insulating layer 274. The exposed portions of the thin layer of insulating material may be removed using an etching process. Removing exposed portions of the thin insulating layer may expose portions of the epitaxial layer 1004 (e.g., portions of a first side of the epitaxial layer 1004 may be exposed). A diffusion process may be performed on the exposed portions of the epitaxial layer 1004, thereby forming the first source region 254, the first drain region 256, the second source region 264, and the second drain region 266.

Additionally, metallization components, such as contacts and interconnects, associated with the first and second semiconductor devices 222 and 224 of FIG. 2 may be formed. For example, a contact 298 may be formed to contact the first source region 254 and a contact 296 may be formed to contact the first drain region 256. As another example, a contact 292 may be formed to contact the second source region 264 and a contact 290 may be formed to contact the second drain region 266. Additionally, contact 294 and interconnects 282, 284, 286, and 288 may be formed. For example, the contact 294 may be formed on the STI region 1006.

Additionally, the ILD 217 may be formed by depositing dielectric material. Additionally, the ILD 217 may be planarized by performing chemical-mechanical polishing (CMP).

Figure 11:
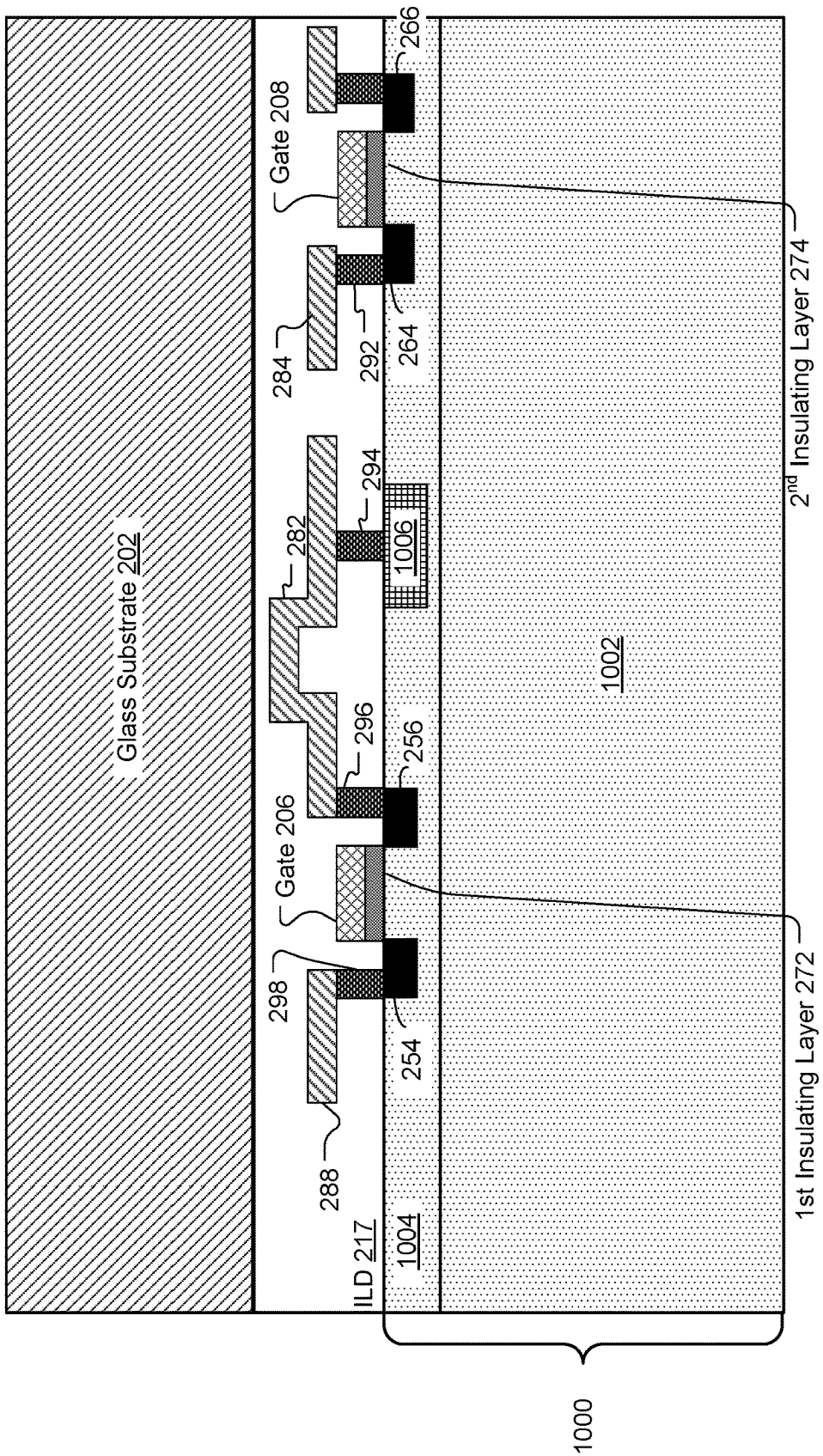
FIG. 11 illustrates an example of a second stage during fabrication of the IC of FIG. 2.

FIG. 11 may illustrate an example of a second stage during fabrication of the IC 200 of FIG. 2. The second stage of FIG. 11 may include coupling a glass substrate to the first and second semiconductor devices 222 and 224. For example, the ILD 217 may be formed of material including oxide, and the glass substrate 202 may be bonded to the ILD 217 using a molecular, fusion, or direct bonding technique, such as oxide-to-oxide bonding.

Figure 12:
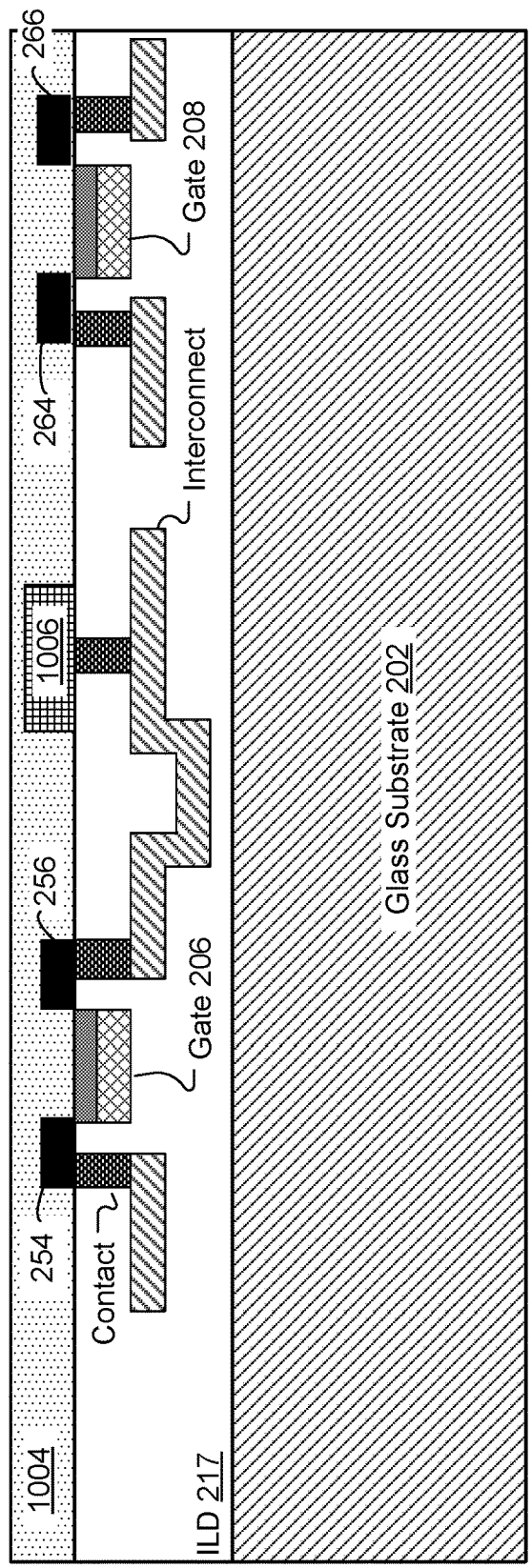
FIG. 12 illustrates an example of a third stage during fabrication of the IC of FIG. 2.

FIG. 12 may illustrate an example of a third stage during fabrication of the IC 200 of FIG. 2. The third stage of FIG. 12 may include thinning the bulk silicon wafer 1000 of FIG. 11. The bulk silicon wafer 1000 may be thinned using a grinding technique and/or an etching technique, such as a wet etching technique. For example, when the bulk silicon wafer 1000 includes the bulk silicon layer 1002 and the epitaxial layer 1004, the third stage of FIG. 12 may include performing a wet etch using a selective etchant that removes the bulk silicon layer 1002 of FIG. 11 and does not remove the epitaxial layer 1004 (e.g., the selective etchant has a large etch selectivity for material of the bulk silicon layer 1002 over material of the epitaxial layer 1004). Removing the bulk silicon layer 1002 may expose the epitaxial layer 1004 (e.g., may expose a second side of the epitaxial layer 1004).

Figure 13:
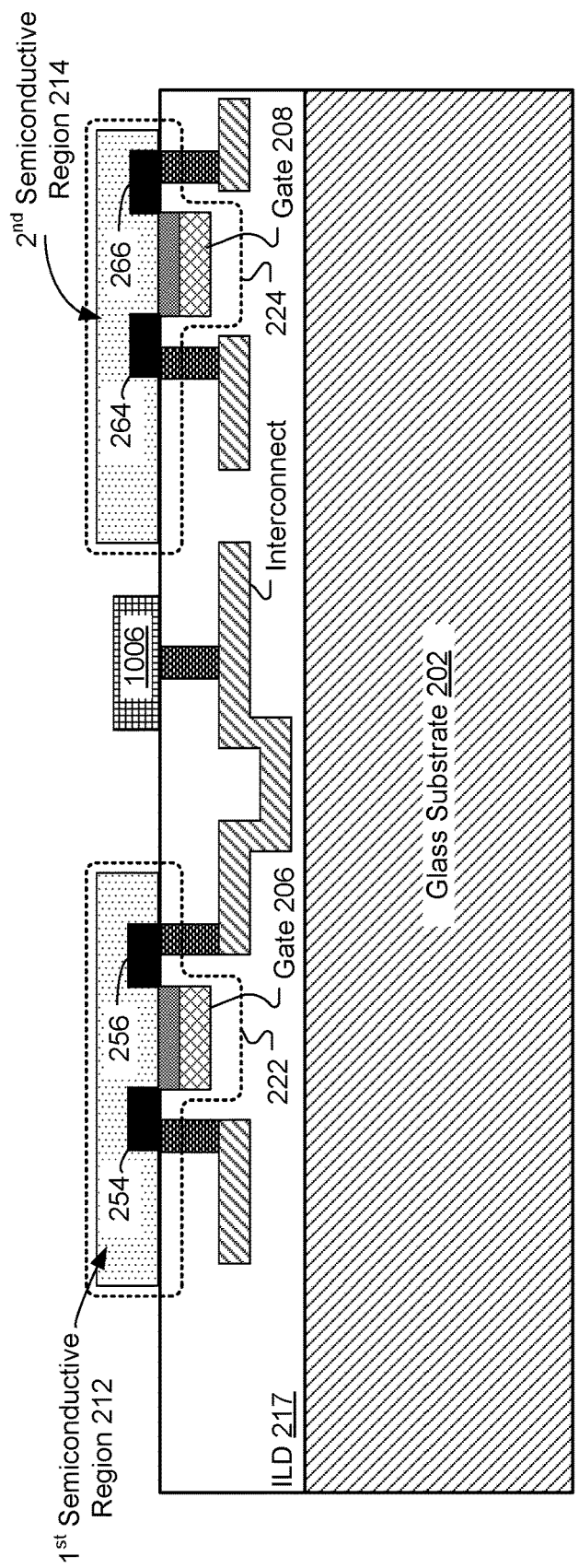
FIG. 13 illustrates an example of a fourth stage during fabrication of the IC of FIG. 2.

FIG. 13 may illustrate an example of a fourth stage during fabrication of the IC 200 of FIG. 2. The fourth stage of FIG. 13 may include removing portions of the bulk silicon wafer 1000 of FIG. 11 that remain after removing the bulk silicon layer 1002 to form first and second islands of semiconductive material corresponding to the first and second semiconductive regions 212 and 214. For example, when the bulk silicon wafer 1000 of FIG. 11 includes the epitaxial layer 1004, the fourth stage of FIG. 13 may include selectively etching portions of the epitaxial layer 1004 of FIG. 12, leaving a first remaining portion of the epitaxial layer 1004 corresponding to the first semiconductive region 212 of FIG. 13 and a second remaining portion of the epitaxial layer 1004 of FIG. 12 corresponding to the second semiconductive region 214 of FIG. 13.

Referring to FIG. 2, an example of a fifth stage during fabrication of the IC 200 of FIG. 2 is illustrated. The fifth stage may be performed after the fourth stage of FIG. 13. The fifth stage may include forming the isolation layer 287, additional interconnects, passive devices (such as inductors), or a combination thereof. For example, the interconnects 283 and 285 may be formed. The interconnects 283 and 285 may be formed of or include copper or aluminum. Before forming the interconnects 283 and 285, the STI region 1006 of FIGS. 10-13 may be removed (e.g., by etching to an etch stop layer). The isolation layer 287 may electrically isolate the interconnect 283 from the interconnect 285. The interconnects 283 and 284 and the isolation layer 287 may be formed using a semi-additive process (SAP).

FIGS. 14-19 illustrate examples of stages during fabrication of an IC including a first semiconductor device and a second semiconductor device formed using a silicon wafer (e.g., the bulk silicon wafer 1000 of FIG. 10) and disposed on a glass substrate. For example, the illustrative stages of FIGS. 14-19 (which may each include multiple steps or processes) may be used to fabricate the IC 300 of FIG. 3.

Figure 14:
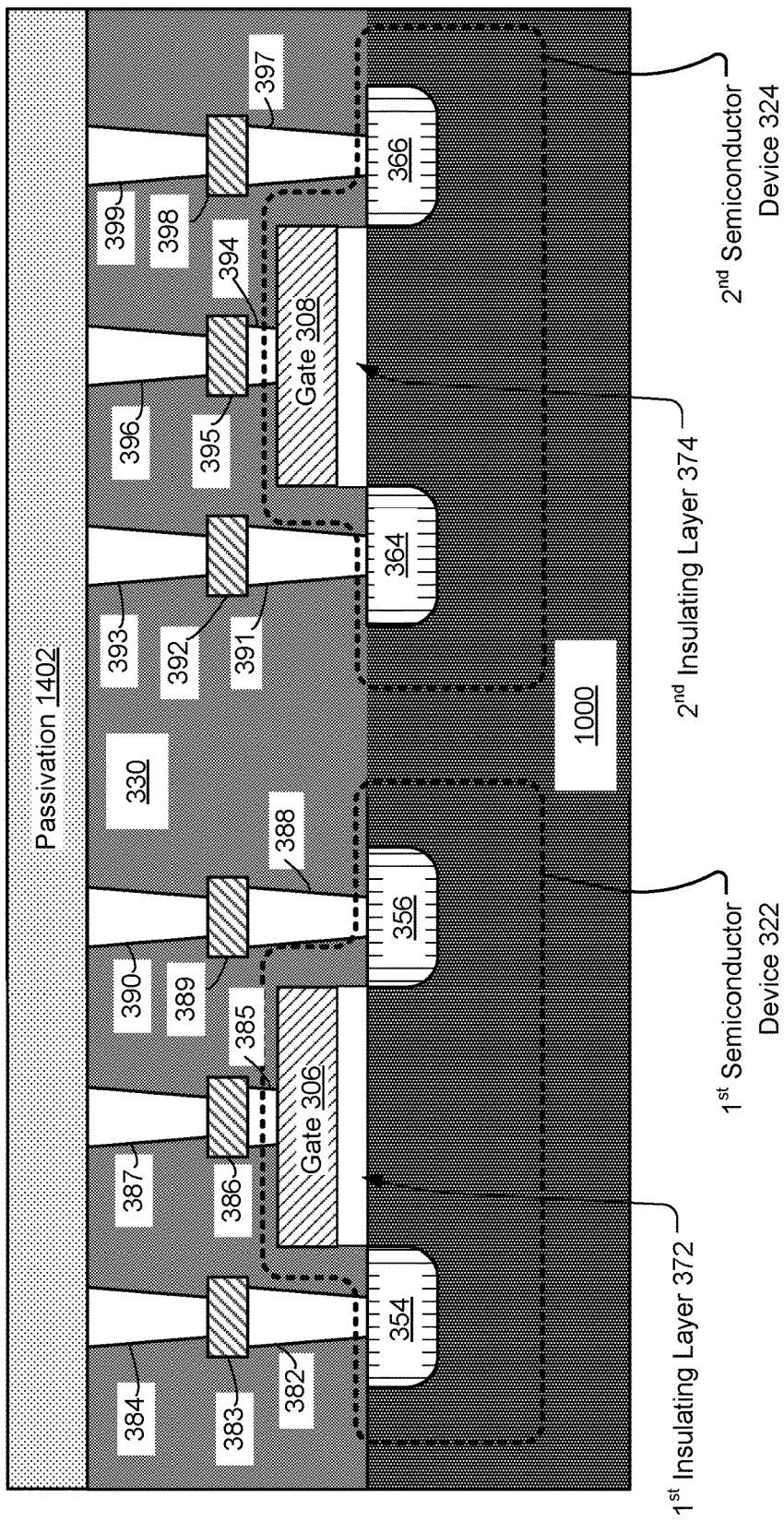
FIG. 14 illustrates an example of a first stage during fabrication of the IC of FIG. 3.

FIG. 14 may illustrate an example of a first stage during fabrication of the IC 300 of FIG. 3. The first stage of FIG. 14 may include fabricating portions of the first semiconductor device 322 and the second semiconductor device 324, fabricating metallization (e.g., contacts and interconnects), forming an inter-layer dielectric layer, and performing chemical mechanical polishing.

For example, a first oxide layer [not illustrated] may be formed on the bulk silicon wafer 1000. In some examples, the first oxide layer may be formed using a wet oxidation technique. The first oxide layer may be etched, exposing first and second regions of the bulk silicon wafer 1000. The areas of the exposed first and second regions of the bulk silicon wafer 1000 may correspond to areas in which the first semiconductive region 312 and the second semiconductive region 314 of FIG. 3, respectively, are located. A thin layer of insulating material, such as $SiO_2$, may be grown over the surface of the etched first oxide layer and the exposed first and second regions of the bulk silicon wafer 1000 of FIG. 14. A gate material layer may be formed over the insulating material. For example, the gate material layer may include or be formed of metal or polysilicon and may be deposited using a CVD technique. The gate material layer may be patterned to form the first gate 306 and the second gate 308. For example, the gate material layer may be patterned using a photolithographic process. Exposed portions of the thin layer of insulating material (e.g., portions of the thin layer of insulating material that are not covered by the first and second gates 306 and 308) may be removed (e.g., using an etch process), leaving the first insulating layer 372 and the second insulating layer 374. Removing exposed portions of the thin insulating layer may expose portions of the bulk silicon wafer 1000. A diffusion process may be performed on the exposed portions of the silicon wafer, thereby forming the first source region 354, the first drain region 356, the second source region 364, and the second drain region 366.

Additionally, metallization components, such as contacts and interconnects, associated with the first and second semiconductor devices 322 and 324 may be formed. For example, contacts 382 and 384 and interconnect 383 may be formed to contact the first source region 354, contacts 388 and 390 and interconnect 389 may be formed to contact the first drain region 356, and contacts 385 and 387 and interconnect 386 may be formed to contact the first gate 306. As another example, contacts 391 and 393 and interconnect 392 may be formed to contact the second source region 364, contacts 397 and 399 and interconnect 398 may be formed to contact the second drain region 366, and contacts 394 and 396 and interconnect 395 may be formed to contact the second gate 308.

Additionally, the ILD 330 may be formed by depositing dielectric material. The ILD 330 may be planarized by performing chemical-mechanical polishing (CMP) and a passivation 1402 may be formed on the planarized ILD 330.

Figure 15:
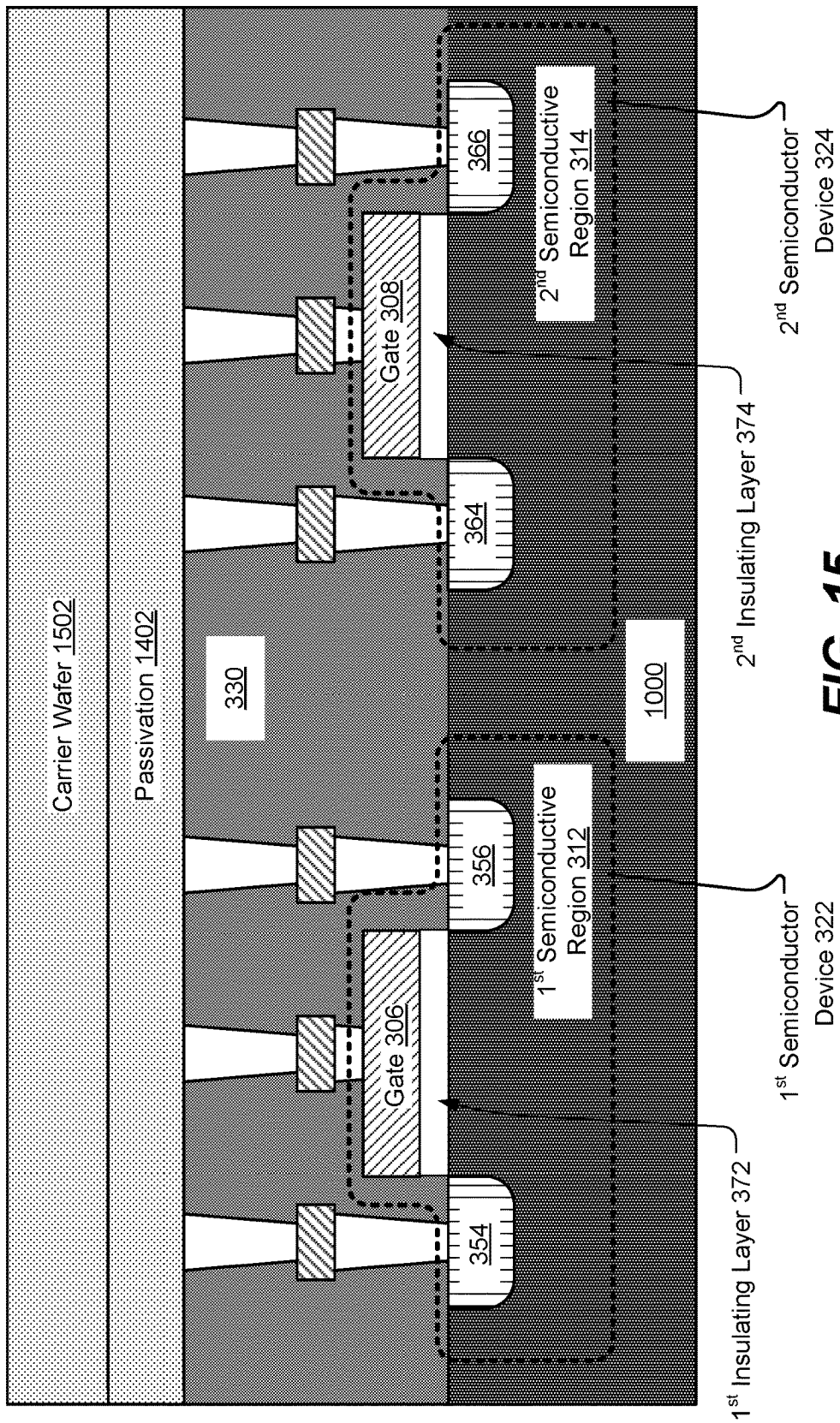
FIG. 15 illustrates an example of a second stage during fabrication of the IC of FIG. 3.

FIG. 15 may illustrate an example of a second stage during fabrication of the IC 300 of FIG. 3. The second stage of FIG. 15 may include attaching a carrier wafer 1502 to the wafer. In some examples, the carrier wafer 1502 may include or be formed of glass. In some examples, the carrier wafer 1502 may be attached using an adhesive (e.g., glue [not illustrated]).

Figure 16:
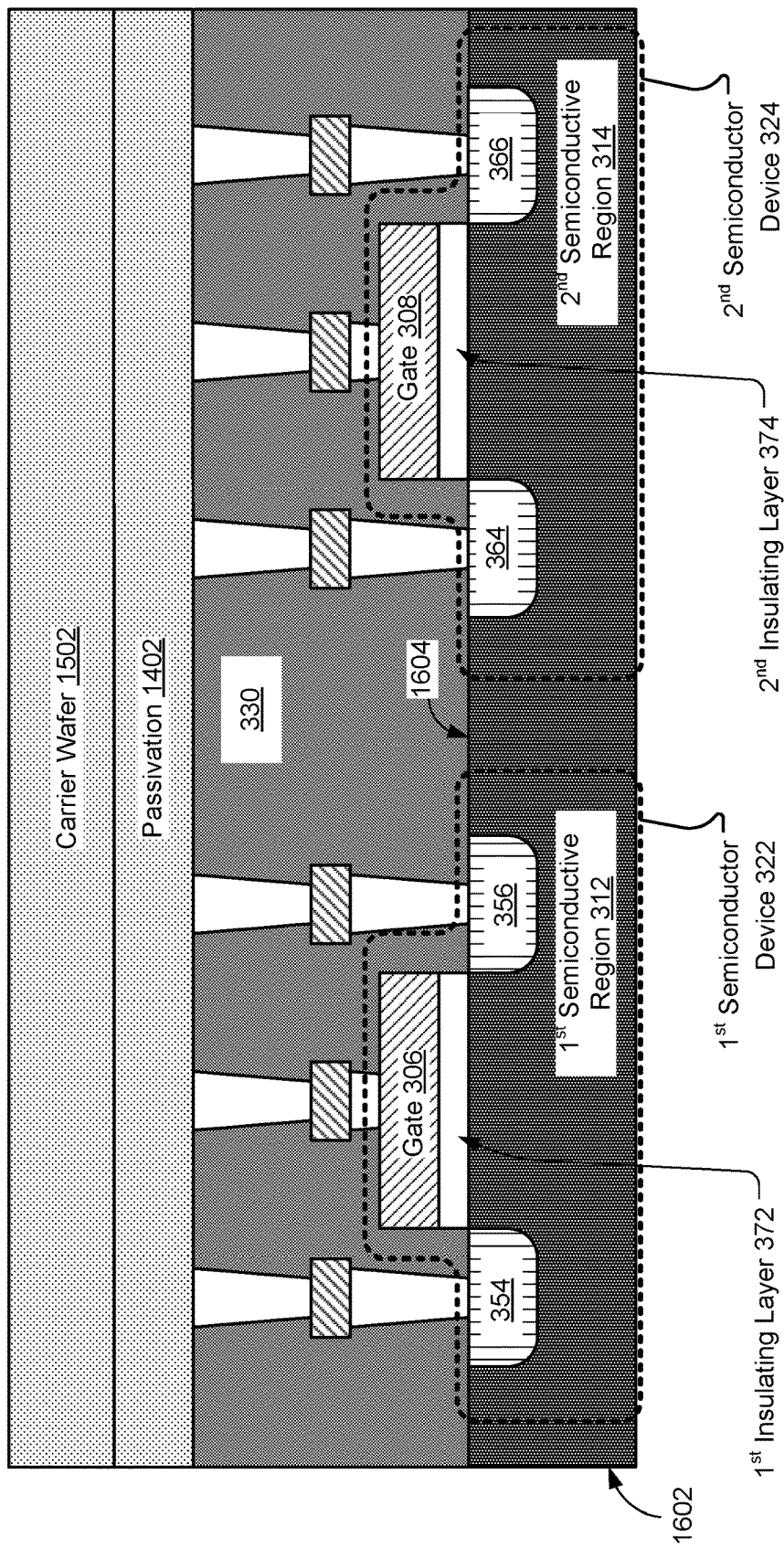
FIG. 16 illustrates an example of a third stage during fabrication of the IC of FIG. 3.

FIG. 16 may illustrate an example of a third stage during fabrication of the IC 300 of FIG. 3. The third stage of FIG. 16 may include thinning the bulk silicon wafer 1000 of FIG. 15 to form a thinned bulk silicon wafer 1602 or layer of FIG. 16. In some examples, the bulk silicon wafer 1000 of FIG. 16 may be thinned using a mechanical grind technique and/or a chemical mechanical polishing. To illustrate, the bulk silicon wafer 1000 may have a thickness of about 10 microns, a mechanical grind may be performed to thin the bulk silicon wafer 1000 to a thickness of about 2 microns or below, and then a chemical mechanical polishing process may be performed to further thin the silicon wafer, resulting in the thinned bulk silicon wafer 1602 of FIG. 16.

Figure 17:
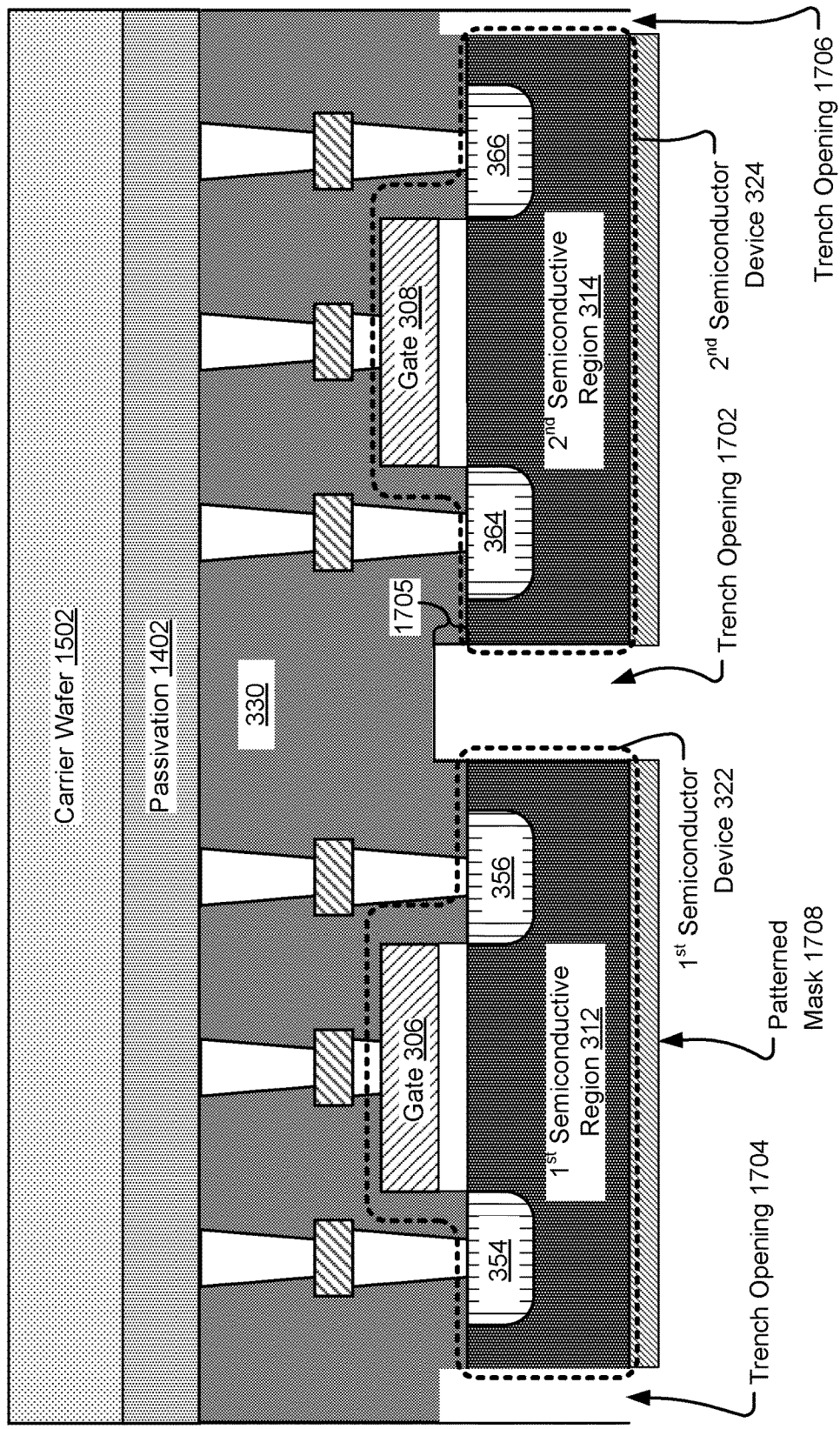
FIG. 17 illustrates an example of a fourth stage during fabrication of the IC of FIG. 3.

FIG. 17 may illustrate an example of a fourth stage during fabrication of the IC 300 of FIG. 3. The fourth stage of FIG. 17 may include forming one or more trench openings that include a portion extending beyond a surface of the thinned bulk silicon wafer 1602 of FIG. 16. For example, the fourth stage of FIG. 17 may include forming the trench openings 1702, 1704, and/or 1706 extending through the thinned bulk silicon wafer 1602 of FIG. 16 and including a portion extending beyond a surface of the thinned bulk silicon wafer 1602. In some examples, the surface may correspond to surface 1604 of FIG. 16. For example, the fourth stage of FIG. 17 may include forming the trench opening 1702 including a portion 1705 extending beyond the surface 1604 of FIG. 16. The trench openings 1702, 1704, and/or 1706 of FIG. 17 may be formed by etching through the thinned bulk silicon wafer 1602 of FIG. 16 into a layer (e.g., the ILD 330 of FIG. 16) located beyond the surface 1604 of the thinned bulk silicon wafer 1602 of FIG. 16. The ILD 330 may be located between the thinned bulk silicon wafer 1602 and the carrier wafer 1502. The trench openings 1702, 1704, and/or 1706 may be formed using a selective etching process to etch through the thinned bulk silicon wafer 1602 of FIG. 16 into the ILD 330. To illustrate, a mask may be deposited and patterned (e.g., a patterned mask 1708 of FIG. 17) on surface 1604 of FIG. 16 of the thinned bulk silicon wafer 1602. The patterned mask 1708 may expose a portion of the thinned bulk silicon wafer 1602 at a location corresponding to a location of the through substrate trench 370 of FIG. 3. One or more wet or dry etches may be performed to etch through the thinned bulk silicon wafer 1602 of FIG. 16 and partially into the ILD 330 to form the trench openings 1702, 1704, and/or 1706 of FIG. 17.

Figure 18:
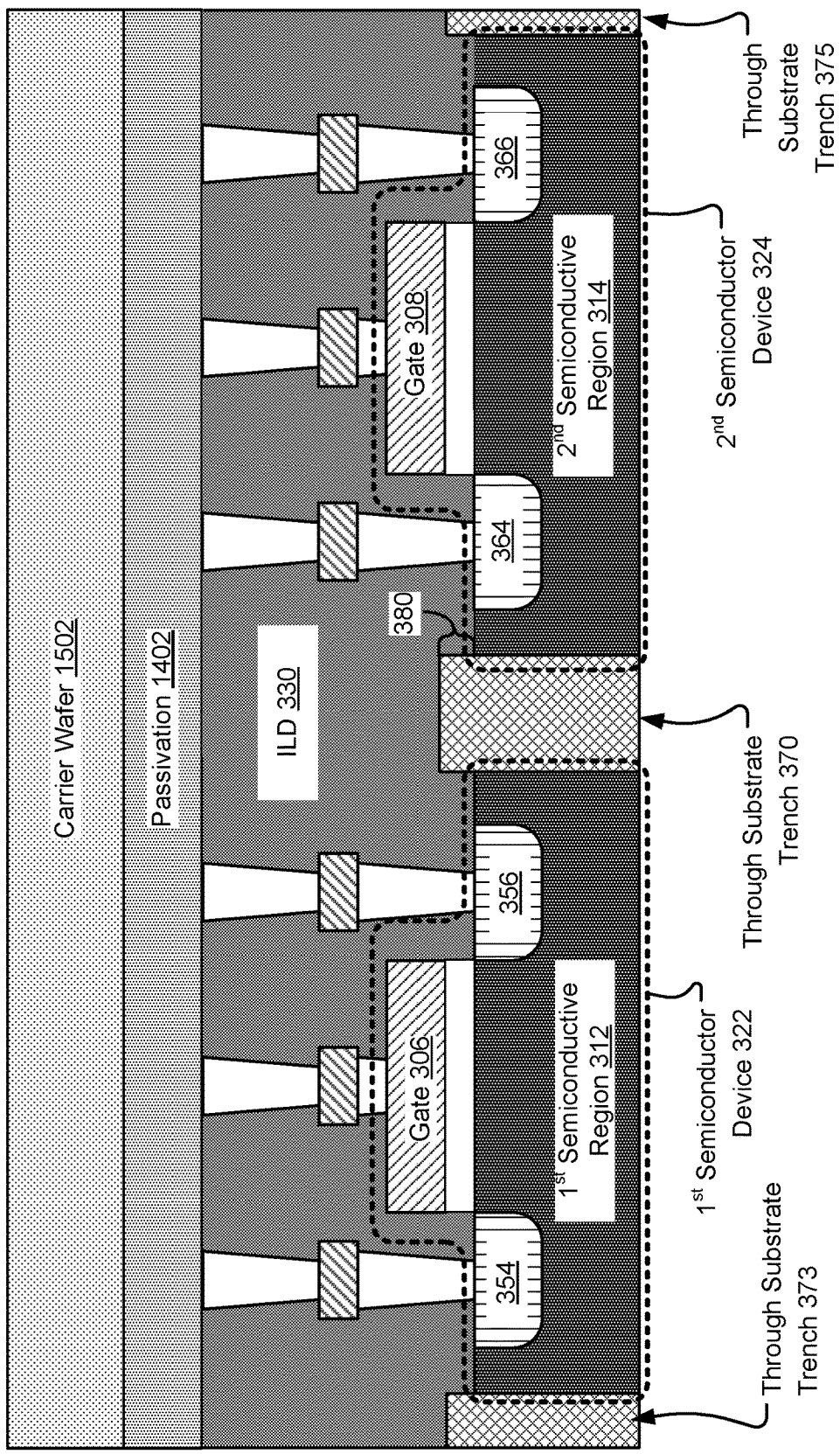
FIG. 18 illustrates an example of a fifth stage during fabrication of the IC of FIG. 3.

FIG. 18 may illustrate an example of a fifth stage during fabrication of the IC 300 of FIG. 3. The fifth stage of FIG. 18 may include filling the trench openings 1702, 1704, and/or 1706 of FIG. 17 with one or more dielectric materials to form the through substrate trenches 370, 373, and/or 375 of FIG. 18. In some examples, the trench openings 1702, 1704, and/or 1706 of FIG. 17 may be filled with dielectric material including an oxide using an oxidation process. The through substrate trenches 370, 373, and/or 375 may include a portion disposed beyond a surface of the thinned bulk silicon wafer 1602 of FIG. 16. For example, the through substrate trench 370 of FIG. 18 may include a portion 380 disposed beyond the surface 1604 of FIG. 16 (e.g., in dielectric material of the ILD 330 of FIG. 16).

Figure 19:
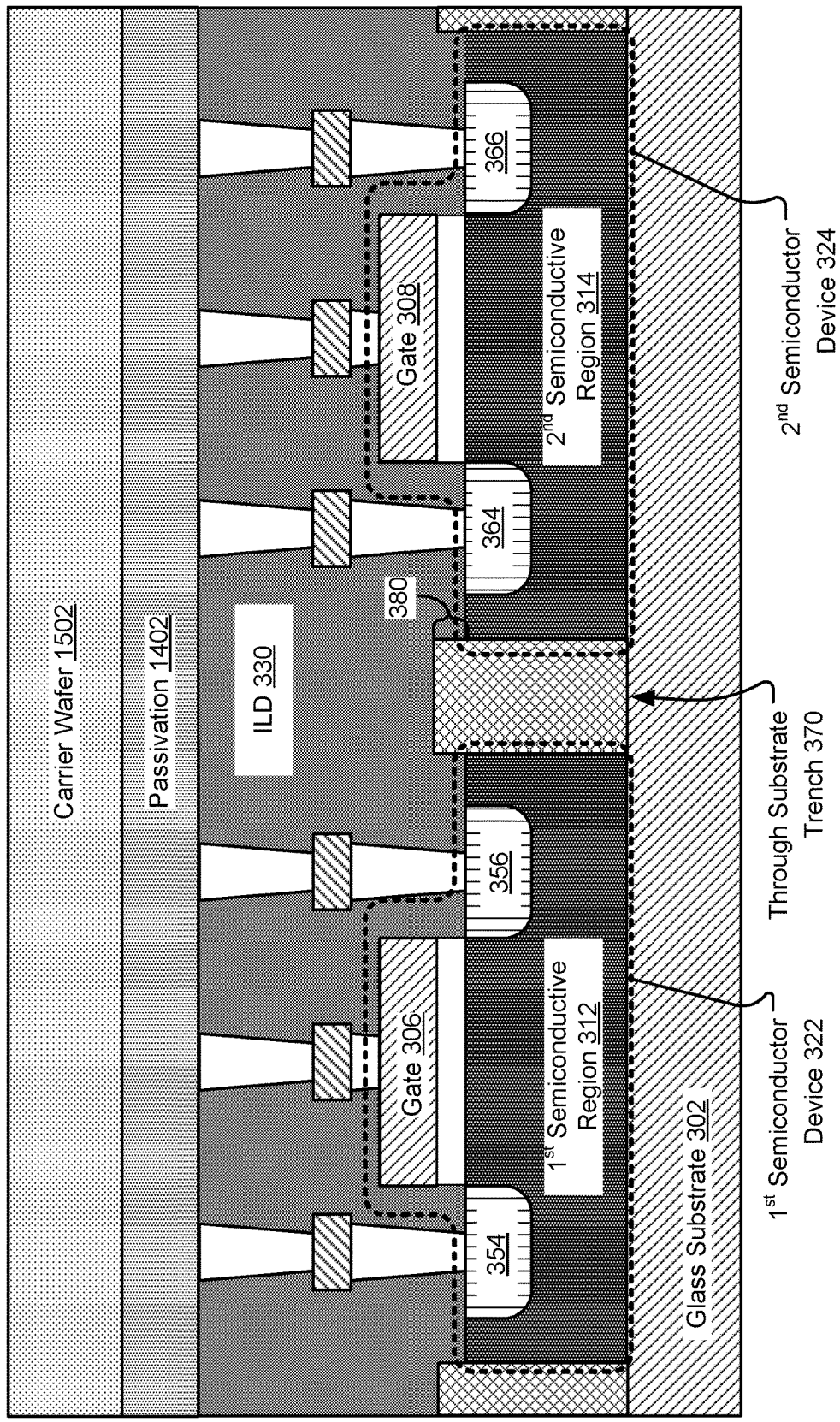
FIG. 19 illustrates an example of a sixth stage during fabrication of the IC of FIG. 3.

FIG. 19 may illustrate an example of a sixth stage during fabrication of the IC 300 of FIG. 3. The sixth stage of FIG. 19 may include coupling the glass substrate 302 to the first and second semiconductor devices 322 and 324. For example, the glass substrate 302 may be coupled to the first and second semiconductor devices 322 and 324 using a bonding process to bond the glass substrate 302 to the semiconductive material of the first and second semiconductive regions 312 and 314.

Referring to FIG. 3, an example of a seventh stage during fabrication of the IC 300 of FIG. 3 is illustrated. The seventh stage may be performed after the sixth stage of FIG. 19. The seventh stage may include removing the carrier wafer 1502 of FIG. 19. In some examples, the carrier wafer 1502 may be removed using an etching process or using another separation process, such as by softing a layer of glue thermally or removing the layer of glue using laser ablation. The seventh stage of FIG. 3 may further include forming additional metallization. For examples, a redistribution layer (RDL) 340 may be formed and a dielectric layer 309 may be deposited.

FIGS. 20-25 may illustrate examples of stages during fabrication of an IC including a first semiconductor device and a second semiconductor device formed using a silicon wafer (e.g., the bulk silicon wafer 1000) and disposed on a glass substrate. For example, the illustrative stages of FIGS. 20-25 (which may each include multiple steps or processes) may be used to fabricate the IC 400 of FIG. 4.

Figure 20:
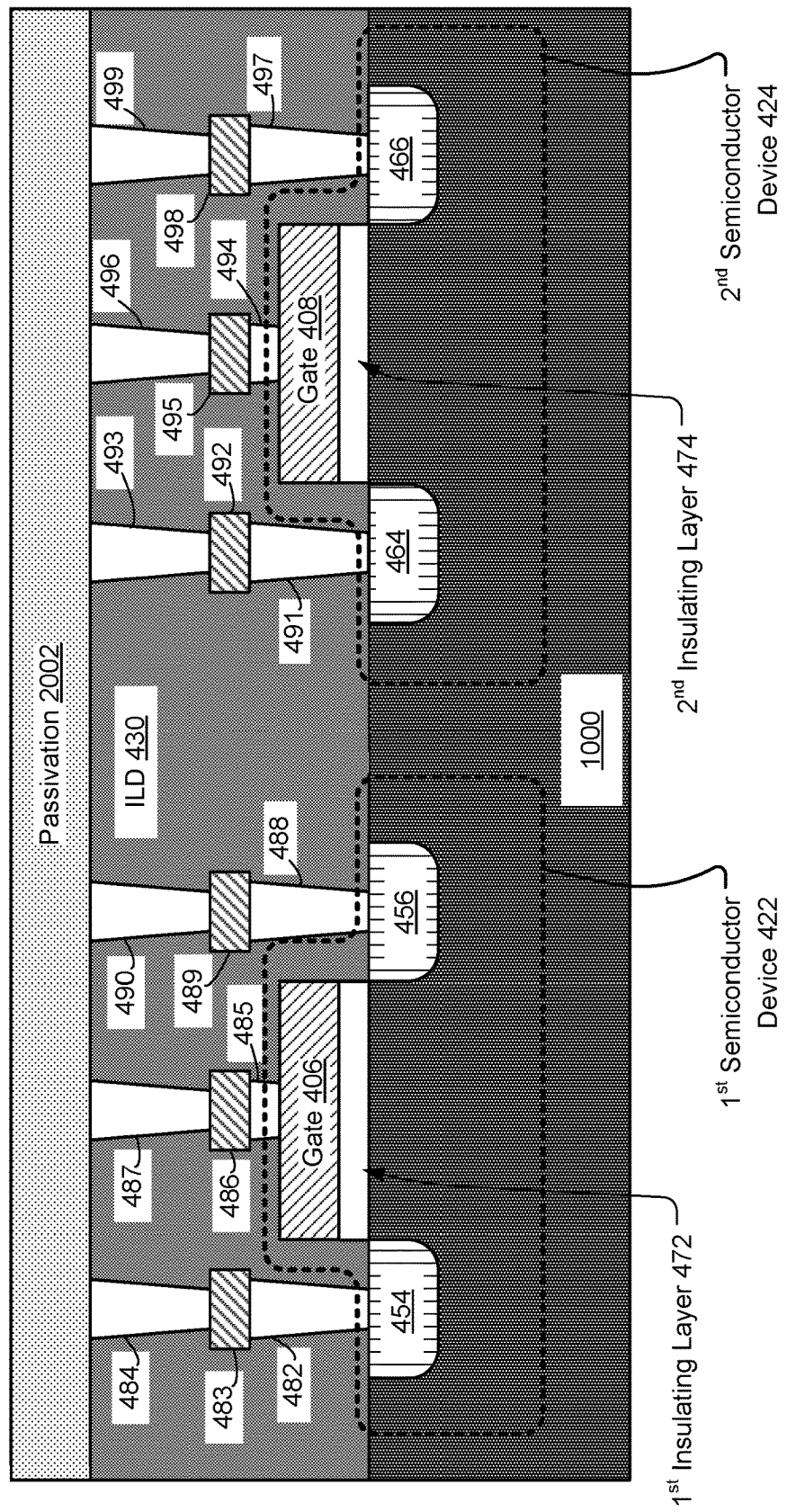
FIG. 20 illustrates an example of a first stage during fabrication of the IC of FIG. 4.

FIG. 20 may illustrate an example of a first stage during fabrication of the IC 400 of FIG. 4. The first stage of FIG. 20 may include fabricating portions of the first semiconductor device 422 and the second semiconductor device 424, fabricating metallization (e.g., contacts and interconnects), forming an inter-layer dielectric layer, and performing chemical mechanical polishing, as described above with reference to FIG. 14.

For example, a first oxide layer [not illustrated] may be formed on the bulk silicon wafer 1000. In some examples, the first oxide layer may be formed using a wet oxidation technique. The first oxide layer may be etched, exposing first and second regions of the bulk silicon wafer 1000. The areas of the exposed first and second regions of the bulk silicon wafer 1000 may correspond to areas in which the first semiconductive region 412 and the second semiconductive region 414 of FIG. 4, respectively, are located. A thin layer of insulating material, such as $SiO_2$, may be grown over the surface of the etched first oxide layer and the exposed first and second regions of the bulk silicon wafer 1000 of FIG. 20. A gate material layer may be formed over the insulating material. For example, the gate material layer may include or be formed of metal or polysilicon and may be deposited using a CVD technique. The gate material layer may be patterned to form the first gate 406 and the second gate 408. For example, the gate material layer may be patterned using a photolithographic process. Exposed portions of the thin layer of insulating material (e.g., portions of the thin layer of insulating material that are not covered by the first and second gates 406 and 408) may be removed (e.g., using an etch process), leaving the first insulating layer 472 and the second insulating layer 474. Removing exposed portions of the thin insulating layer may expose portions of the bulk silicon wafer 1000. A diffusion process may be performed on the exposed portions of the silicon wafer, thereby forming the first source region 454, the first drain region 456, the second source region 464, and the second drain region 466.

Additionally, metallization components, such as contacts and interconnects, associated with the first and second semiconductor devices 422 and 424 may be formed. For example, contacts 482 and 484 and interconnect 483 may be formed to contact the first source region 454, contacts 488 and 490 and interconnect 489 may be formed to contact the first drain region 456, and contacts 485 and 487 and interconnect 486 may be formed to contact the first gate 406. As another example, contacts 491 and 493 and interconnect 492 may be formed to contact the second source region 464, contacts 497 and 499 and interconnect 498 may be formed to contact the second drain region 466, and contacts 494 and 496 and interconnect 495 may be formed to contact the second gate 408. Additionally, the ILD 430 may be formed by depositing dielectric material. The ILD 430 may be planarized by performing chemical-mechanical polishing (CMP) and a passivation 2002 may be formed on the planarized ILD 330.

Figure 21:
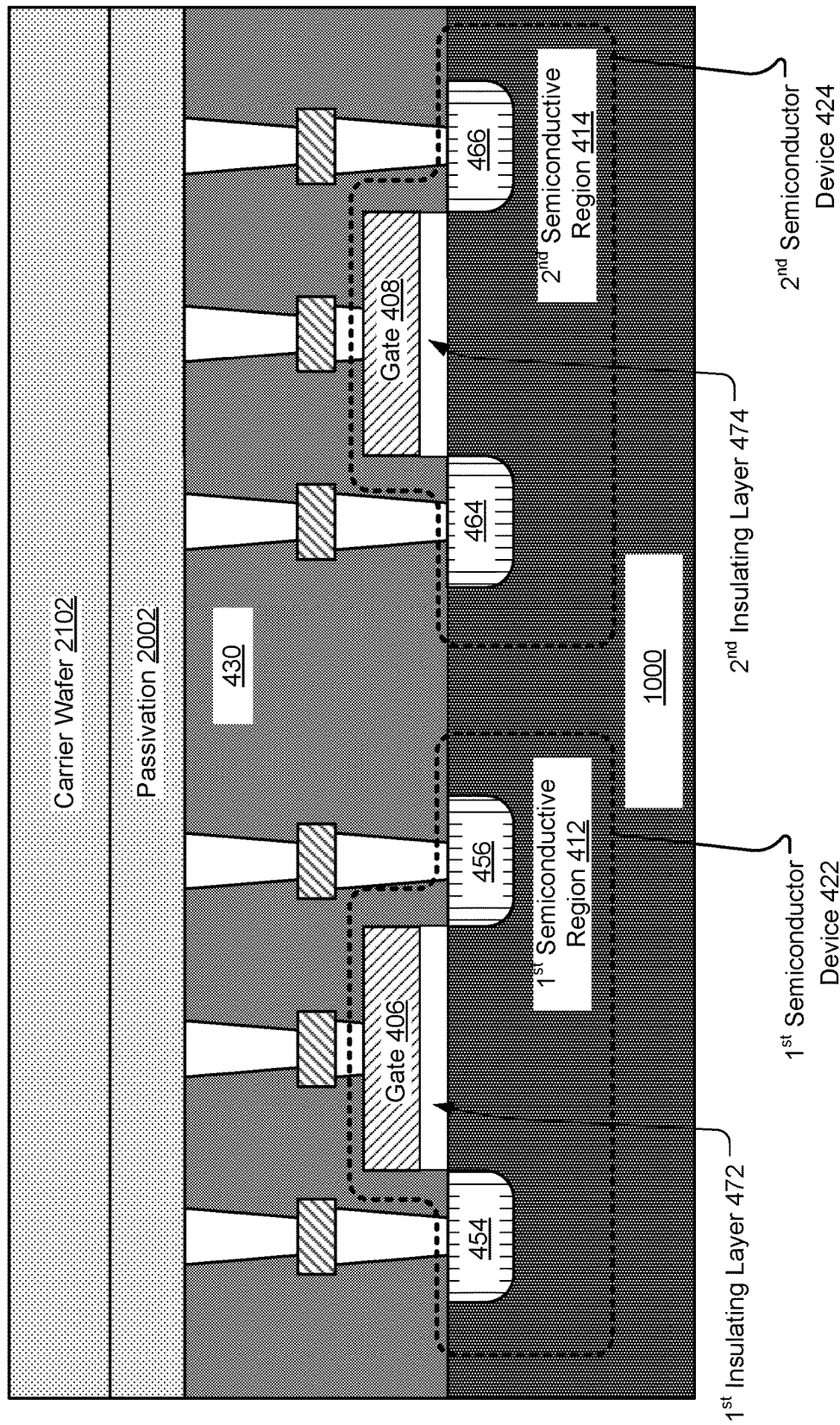
FIG. 21 illustrates an example of a second stage during fabrication of the IC of FIG. 4.

FIG. 21 may illustrate an example of a second stage during fabrication of the IC 400 of FIG. 4. The second stage of FIG. 21 may include attaching a carrier wafer 2102 to the wafer. In some examples, the carrier wafer 2102 may include or be formed of glass, and the carrier wafer 2102 may be attached using an adhesive.

Figure 22:
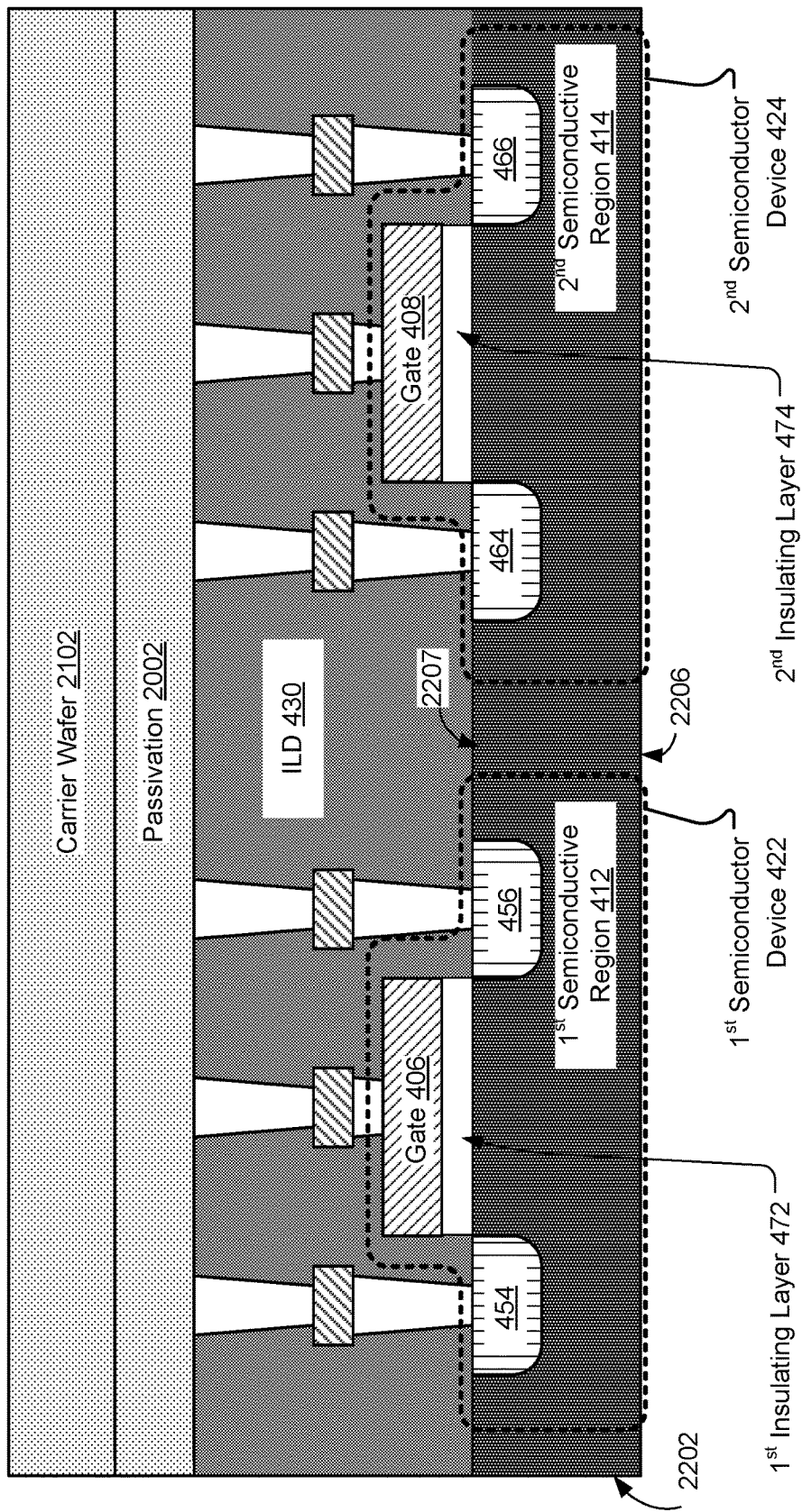
FIG. 22 illustrates an example of a third stage during fabrication of the IC of FIG. 4.

FIG. 22 may illustrate an example of a third stage during fabrication of the IC 400 of FIG. 4. The third stage of FIG. 22 may include thinning the bulk silicon wafer 1000 of FIG. 21 to form the thinned bulk silicon wafer 2202 of FIG. 22. In some examples, the bulk silicon wafer 1000 of FIG. 21 may be thinned using a mechanical grind technique and/or a chemical mechanical polishing. To illustrate, the bulk silicon wafer 1000 may have a thickness of about 10 microns, a mechanical grind may be performed to thin the bulk silicon wafer 1000 to a thickness of about 2 microns, and then a chemical mechanical polishing process may be performed to further thin the silicon wafer, resulting in the thinned bulk silicon wafer 2202 of FIG. 22.

Figure 23:
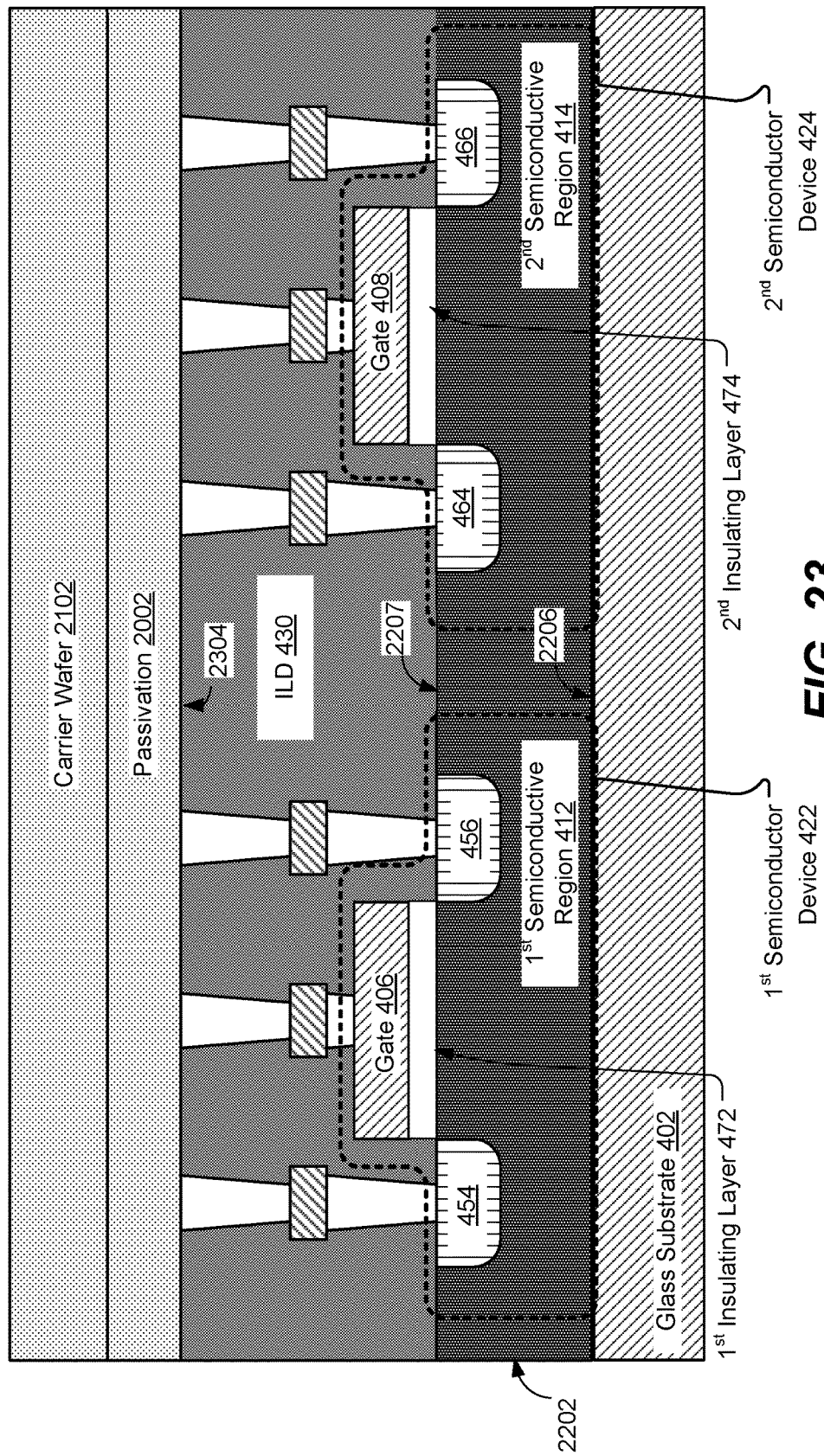
FIG. 23 illustrates an example of a fourth stage during fabrication of the IC of FIG. 4.

FIG. 23 may illustrate an example of a fourth stage during fabrication of the IC 400 of FIG. 4. The fourth stage of FIG. 23 may include coupling the glass substrate 402 to the first and second semiconductor devices 422 and 424. For example, the glass substrate 402 may be coupled to the first and second semiconductor devices 422 and 424 using a bonding process to bond the glass substrate 402 to the semiconductive material of the first and second semiconductive regions 412 and 414.

Figure 24:
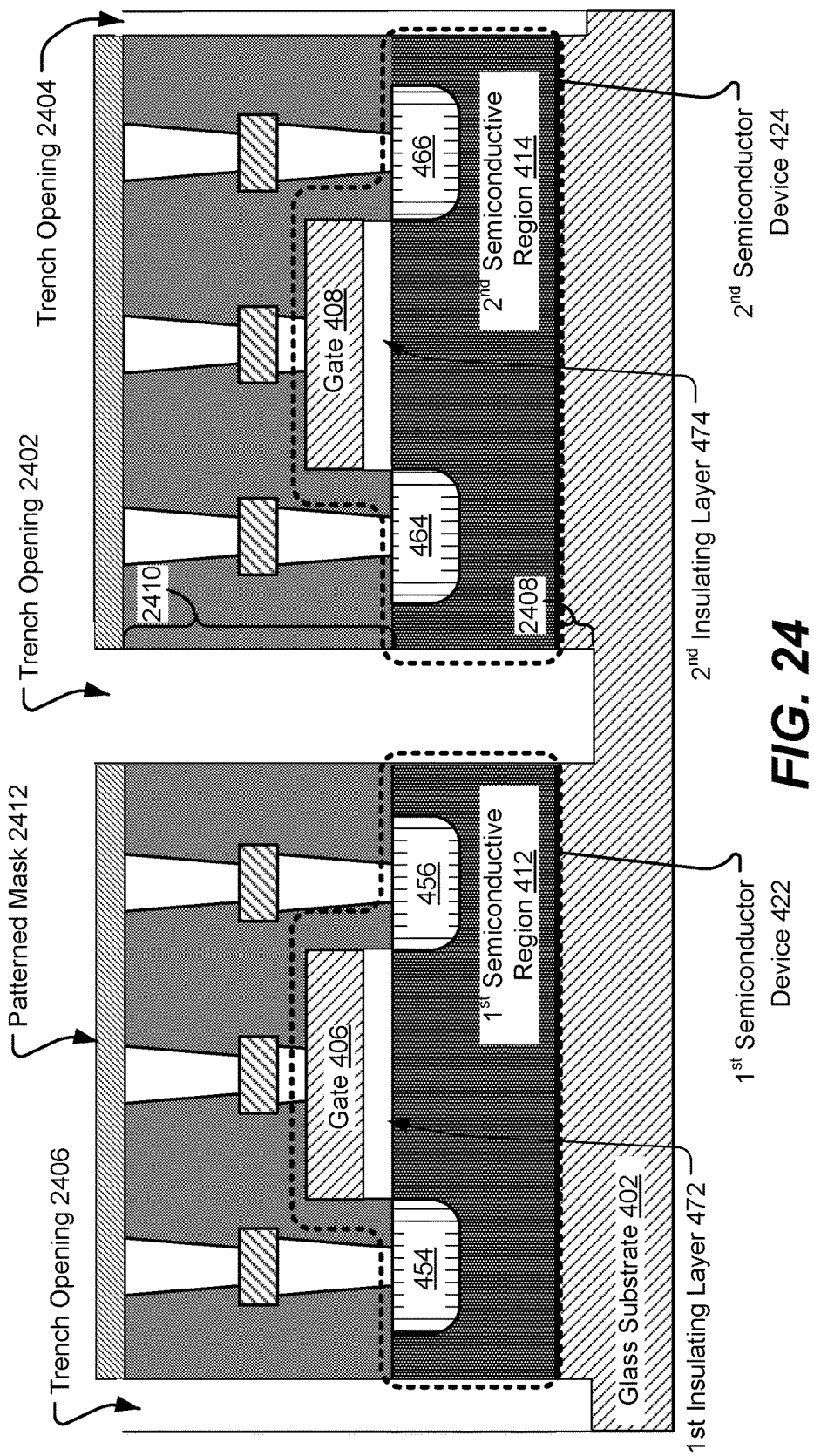
FIG. 24 illustrates an example of a fifth stage during fabrication of the IC of FIG. 4.

FIG. 24 may illustrate an example of a fifth stage during fabrication of the IC 400 of FIG. 4. The fifth stage of FIG. 24 may include removing the carrier wafer 2102 of FIG. 23 and forming trench openings 2402, 2404, and/or 2406. The trench openings 2402, 2404, and/or 2406 may extend through (e.g., extending completely through) the thinned bulk silicon wafer 2202 of FIG. 23 and beyond a surface of the thinned bulk silicon wafer 2202 of FIG. 23. For example, the surface may correspond to surface 2206 and/or to surface 2207 of FIG. 23. For example, the trench opening 2402 of FIG. 24 may be formed by etching through the ILD 430 of FIG. 23, through the thinned bulk silicon wafer 2202 of FIG. 23, and into the glass substrate 402 of FIG. 23. The trench opening 2402 of FIG. 24 may include a portion 2410 extending beyond the surface 2206 of FIG. 23 and/or may include a portion 2408 of FIG. 24 extending beyond the surface 2207 of FIG. 23. The ILD 430 may be located proximate to the first and second semiconductor devices 422 and/or 424 and proximate to portions of the thinned bulk silicon wafer 2202. In some examples, the trench openings 2402, 2404, and/or 2406 of FIG. 24 may be formed using a selective etching process to etch through the ILD 430 of FIG. 23, through the thinned bulk silicon wafer 2202, and into the glass substrate 402. To illustrate, a mask may be deposited and patterned (e.g., patterned mask 2412) on surface 2304 of FIG. 23 of the thinned bulk silicon wafer 2202. The patterned mask 2412 may expose portions of the surface 2304 of the ILD 430 at locations corresponding to locations of the through substrate trenches 470, 473, and/or 475 of FIG. 4. One or more wet or dry etches may be performed to etch through the ILD 430 of FIG. 23, the thinned bulk silicon wafer 2202, and partially into the glass substrate 402 to form the trench openings 2402, 2404, and/or 2406 of FIG. 24.

Figure 25:
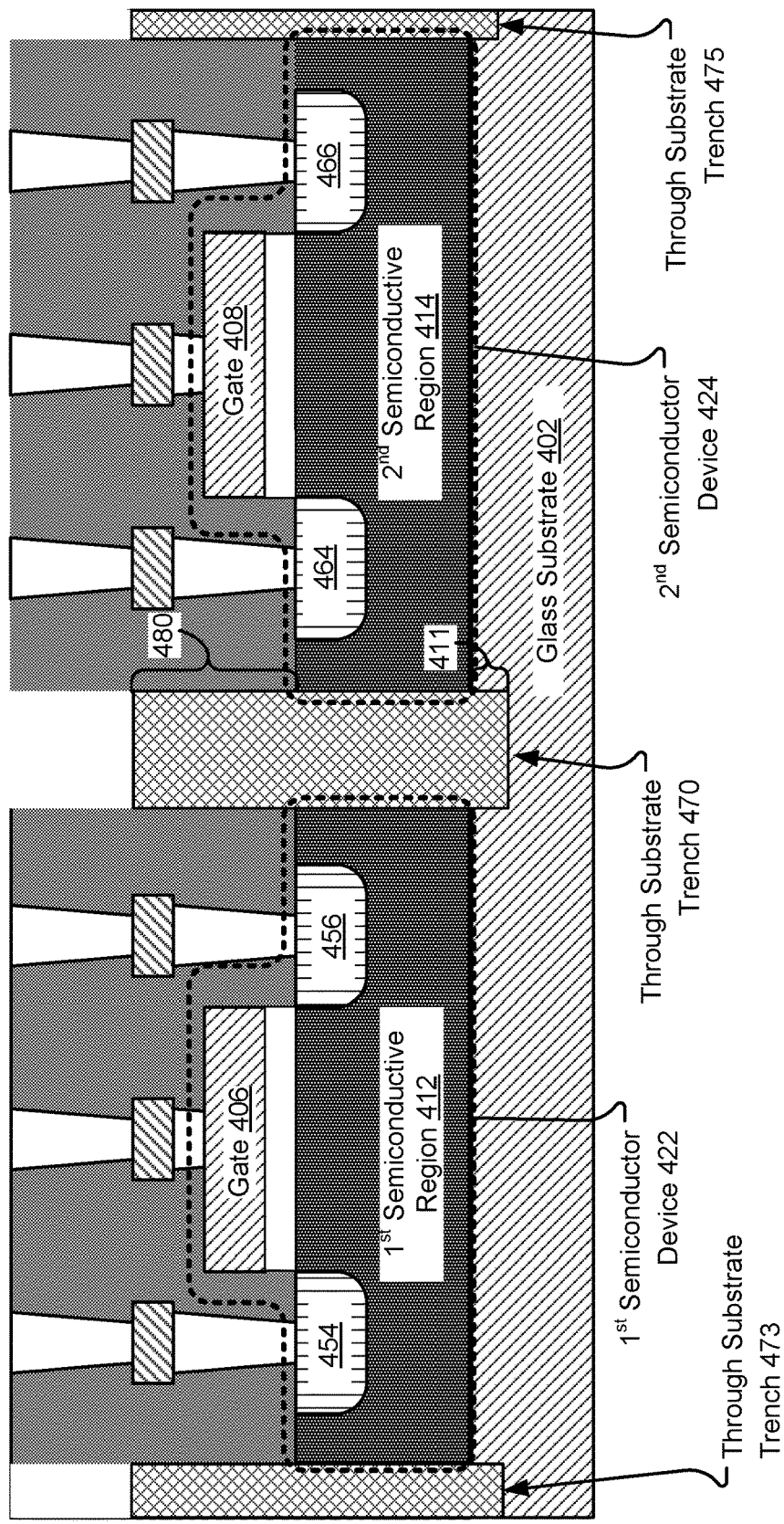
FIG. 25 illustrates an example of a sixth stage during fabrication of the IC of FIG. 4.

FIG. 25 may illustrate an example of a sixth stage during fabrication of the IC 400 of FIG. 4. The sixth stage of FIG. 25 may include filling the trench openings 2402, 2404, and/or 2406 of FIG. 24 with one or more dielectric materials to form the through substrate trenches 470, 473, and/or 475 of FIG. 25. In some examples, the trench openings 2402, 2404, and/or 2406 of FIG. 24 may be filled with dielectric material including an oxide using an oxidation process.

Each of the through substrate trenches 470, 473, and/or 475 of FIG. 25 may include a portion disposed in dielectric material of a dielectric layer proximate to the first semiconductive region 412 and the second semiconductive region 414. For example, the through substrate trench 470 may include the portion 480 disposed in dielectric material of the ILD 430. Thus, the through substrate trench 470 may include the portion 480 disposed beyond the surface 2207 of FIG. 23 of the bulk silicon wafer 1000 of FIG. 20 or the thinned bulk silicon wafer 2202 of FIG. 23 (into a region previously occupied by dielectric material of the ILD 430). Additionally, the through substrate trench 470 of FIG. 25 may include a portion 411 disposed beyond the surface 2206 of FIG. 23 of the thinned bulk silicon wafer 2202 (e.g., into a region previously occupied by the glass substrate 402 of FIG. 23).

Referring to FIG. 4, an example of a seventh stage during fabrication of the IC 400 of FIG. 4 is illustrated. The seventh stage may be performed after the sixth stage of FIG. 25. The seventh stage of FIG. 4 may include forming additional metallization. For example, a redistribution layer (RDL) 440 and a dielectric layer 403 may be formed.

Figure 26:
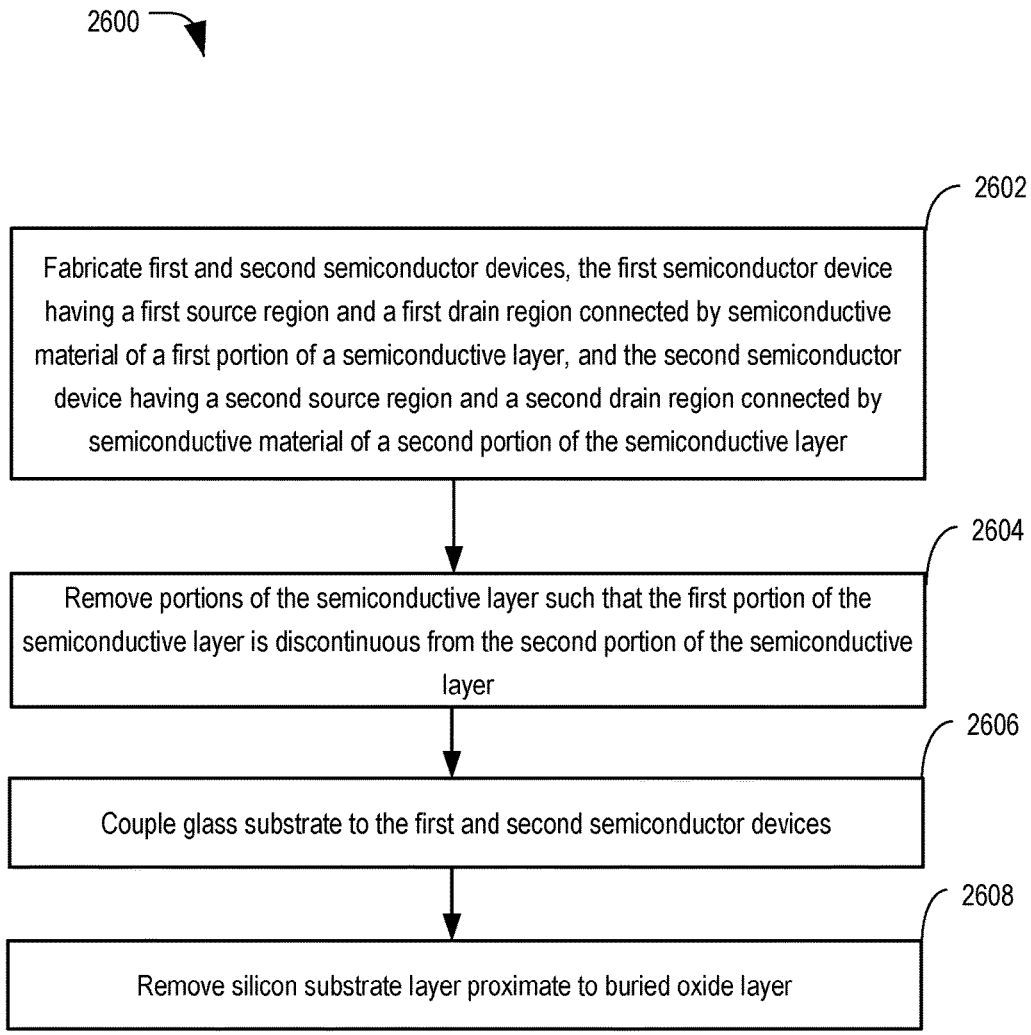
FIG. 26 is a flow chart of a particular illustrative example of a method of forming the IC of FIG. 1.

Referring to FIG. 26, a flow chart of an illustrative example of a method 2600 of fabricating an electronic device is depicted. The electronic device may include the IC 100 of FIG. 1. The method may include the first, second, and third stages described with reference to FIGS. 5, 6, and 7, respectively.

For example, the method 2600 of FIG. 26 may include fabricating, at 2602, a first semiconductor device and a second semiconductor device. The first semiconductor device may have a first source region and a first drain region connected by semiconductive material of a first portion of a semiconductive layer, and the second semiconductor device may have a second source region and a second drain region connected by semiconductive material of a second portion of the semiconductive layer. The first and second semiconductor devices may correspond to the first and second semiconductor devices 122 and 124 of FIG. 1. The semiconductive layer may correspond to a silicon layer of a SOI wafer proximate to a first side of a buried oxide layer (e.g., the buried oxide layer 152 of FIG. 1) of the SOI wafer. The first and second portions may correspond to the first and second semiconductive regions 112 and 114 of FIG. 1.

The first and second semiconductor devices may be fabricated using any technique. For example, a first oxide layer [not illustrated] may be formed on the silicon layer of the SOI wafer. In some examples, the first oxide layer may be formed using a wet oxidation technique. The first oxide layer may be etched, exposing first and second regions of the silicon layer of the SOI wafer. The exposed first and second regions of the silicon layer of the SOI wafer may correspond to locations of the first and second semiconductive regions 112 and 114 of FIG. 1, respectively. A thin layer of insulating material, such as $SiO_2$, may be formed over the surface of the etched first oxide layer and the exposed first and second regions of the silicon layer of the SOI wafer. A gate material layer may be grown over the insulating material. For example, the gate material layer may include or be formed of metal or polysilicon and may be deposited using a chemical vapor deposition (CVD) technique. The gate material layer may be patterned to form the first gate 106 and the second gate 108 of FIG. 1. For example, the gate material layer may be patterned using a photolithographic process. Exposed portions of the thin layer of insulating material may be removed (e.g., using an etch process), leaving the first insulating layer 172 and the second insulating layer 174. Removing exposed portions of the thin insulating layer may expose portions of the first and second regions of the silicon layer of the SOI wafer. A diffusion process may be performed on the exposed portions of the first and second regions of the silicon layer of the SOI wafer, thereby forming the first source region 154, the first drain region 156, the second source region 164, and the second drain region 166 of FIG. 1.

The method 2600 of FIG. 26 may further include removing, at 2604, portions of the semiconductive layer such that the first portion of the semiconductive layer is discontinuous from the second portion of the semiconductive layer. For example, portions of the silicon layer of the SOI wafer may be removed (e.g., using an etch process), leaving a first island of the silicon layer of the SOI wafer and a second island of the silicon layer of the SOI wafer. The first island may correspond to the first semiconductive region 112 of FIG. 1 and the second island may correspond to the second semiconductive region 114.

Additionally, metallization components, such as contacts and interconnects, associated with the first and second semiconductor devices 122 and 124 of FIG. 1 may be formed. For example, a contact 190 may be formed to contact the first source region 154, and a contact 191 may be formed to contact the first drain region 156. As another example, a contact 193 may be formed to contact the second source region 164, and a contact 194 may be formed to contact the second drain region 166. Additionally, interconnects 189, 195, 196, and/or 197 may be formed.

Additionally, the ILD 117 may be formed by depositing dielectric material. Portions of dielectric material of the ILD 117 between the first and second semiconductor devices 122 and 124 may electrically isolate the first semiconductive region 112 from the second semiconductive region 114. Additionally, the ILD 117 may be planarized by performing chemical-mechanical polishing (CMP).

The method 2600 of FIG. 26 may further include coupling, at 2606, a glass substrate to the first and second semiconductor devices. For example, the glass substrate may correspond to the glass substrate 102 of FIG. 1 and may be coupled to the first and second semiconductor devices as described with reference to the second stage of FIG. 6. For example, the ILD 117 may be formed of material including oxide, and the glass substrate 102 may be bonded to the ILD 117 using a molecular, fusion, or direct bonding technique, such as oxide-to-oxide bonding.

The method 2600 of FIG. 26 may further include removing, at 2608, semiconductor material proximate to a buried oxide layer of an SOI. For example, the silicon substrate layer 501 of FIG. 6 may be removed. In some examples, the silicon substrate layer 501 of FIG. 6 may be removed by grinding the silicon substrate layer 501 and/or performing a wet etch.

The method 2600 of FIG. 26 may further include etching one or more openings into the buried oxide layer 152 as described above with reference to the third stage of FIG. 7, forming openings in the ILD 117 as described above with reference to the fourth stage of FIG. 8, and/or forming contacts as described above with reference to the fifth stage of FIG. 9.

Figure 27:
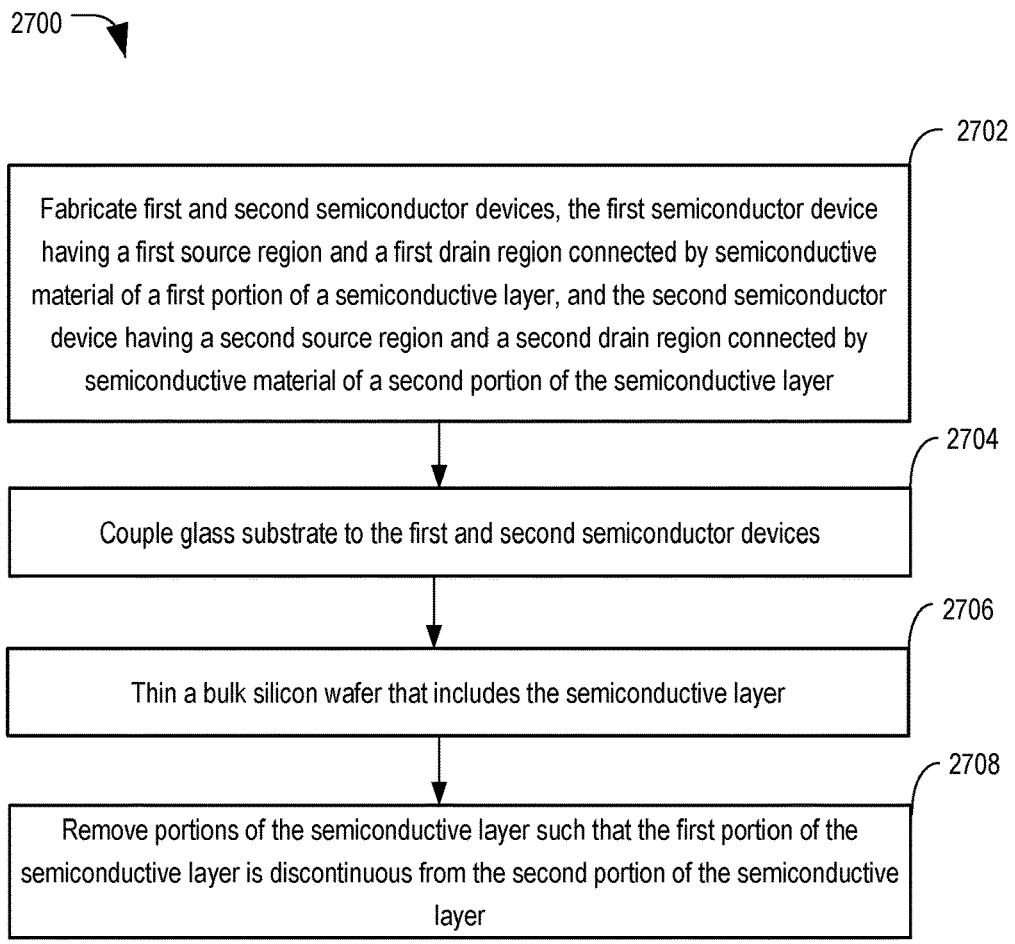
FIG. 27 is a flow chart of a particular illustrative example of a method of forming the IC of FIG. 2.

Referring to FIG. 27, a flow chart of an illustrative example of a method 2700 of fabricating an electronic device is depicted. The electronic device may include the IC 200 of FIG. 2. The method may include the first, second, third, and fourth stages described with reference to FIGS. 10, 11, 12, and 13, respectively.

For example, the method 2700 of FIG. 27 may include fabricating, at 2702, a first semiconductor device and a second semiconductor device. The first semiconductor device may have a first source region and a first drain region connected by semiconductive material of a first portion of a semiconductive layer, and the second semiconductor device may have a second source region and a second drain region connected by semiconductive material of a second portion of the semiconductive layer. The first and second semiconductor devices may correspond to the first and second semiconductor devices 222 and 224 of FIG. 2. The semiconductive layer may correspond to a silicon layer of a bulk silicon wafer, such as the bulk silicon wafer 1000 of FIG. 10. In some examples, the semiconductive layer corresponds to the epitaxial layer 1004 of the bulk silicon wafer 1000. The first and second portions may correspond to the first and second semiconductive regions 212 and 214 of FIG. 2.

The first and second semiconductor devices may be fabricated using any technique. For example, a first oxide layer [not illustrated] may be formed on the epitaxial layer 1004 of FIG. 10. In some examples, the first oxide layer may be formed using a wet oxidation technique. The first oxide layer may be etched, exposing first and second regions of the epitaxial layer 1004. The exposed first and second regions of the epitaxial layer 1004 may correspond to the first semiconductive region 212 and the second semiconductive region 214 of FIG. 2, respectively. A thin layer of insulating material, such as $SiO_2$, may be grown over the surface of the etched first oxide layer and the exposed first and second regions of the epitaxial layer 1004 of FIG. 10. A gate material layer may be formed over the insulating material. For example, the gate material layer may include or may be formed of metal or polysilicon and may be deposited using a CVD technique. The gate material layer may be patterned to form the first gate 206 and the second gate 208. For example, the gate material layer may be patterned using a photolithographic process. Exposed portions of the thin layer of insulating material (e.g., portions of the thin layer of insulating material that are not covered by the first and second gates 206 and 208) may be removed (e.g., using an etching process), leaving the first insulating layer 272 and the second insulating layer 274. Removing exposed portions of the thin insulating layer may expose portions of the epitaxial layer 1004 (e.g., portions of a first side of the epitaxial layer 1004 may be exposed). A diffusion process may be performed on the exposed portions of the epitaxial layer 1004, thereby forming the first source region 254, the first drain region 256, the second source region 264, and the second drain region 266. Alternatively, the first and second semiconductor devices may be formed using a different process. For example, sacrificial gates may be formed and subsequently replaced with a high-K dielectric material and one or more metals to form high-k/metal gates.

Additionally, metallization components, such as contacts and interconnects, associated with the first and second semiconductor devices 222 and 224 of FIG. 2 may be formed. For example, a contact 298 may be formed to contact the first source region 254 and a contact 296 may be formed to contact the first drain region 256. As another example, a contact 292 may be formed to contact the second source region 264 and a contact 290 may be formed to contact the second drain region 266. Additionally, the contact 294 and the interconnects 282, 284, 286, and 288 may be formed.

Additionally, the ILD 217 may be formed by depositing dielectric material. Additionally, the ILD 217 may be planarized by performing chemical-mechanical polishing (CMP).

The method 2700 of FIG. 27 may further include coupling, at 2704, a glass substrate to the first and second semiconductor devices. For example, the glass substrate may correspond to the glass substrate 202 of FIG. 11 and the glass substrate may be coupled to the first and second semiconductor devices as described with reference to the second stage of FIG. 11.

The method 2700 of FIG. 27 may further include thinning, at 2706, the bulk silicon wafer. For example, the bulk silicon wafer 1000 of FIG. 11 may be thinned. The bulk silicon wafer 1000 may be thinned using a grinding technique and/or an etching technique, such as a wet etching technique. For example, when the bulk silicon wafer 1000 includes the bulk silicon layer 1002 and the epitaxial layer 1004, the bulk silicon wafer 1000 may be thinned by performing a wet etch using a selective etchant that removes the bulk silicon layer 1002 and does not remove the epitaxial layer 1004 (e.g., the selective etchant has a large etch selectivity for material of the bulk silicon layer 1002 over material of the epitaxial layer 1004). Removing the bulk silicon layer 1002 may expose the epitaxial layer 1004 (e.g., may expose a second side of the epitaxial layer 1004).

The method 2700 of FIG. 27 may further include removing, at 2708, portions of the semiconductive layer such that the first portion of the semiconductive layer is discontinuous from the second portion of the semiconductive layer. For example, the portions of the semiconductive layer may be removed using an etching process to form first and second islands of semiconductive material corresponding to the first and second semiconductive regions 212 and 214 of FIG. 13. For example, when the bulk silicon wafer 1000 of FIG. 11 includes the epitaxial layer 1004, portions of the epitaxial layer 1004 of FIG. 12 may be etched, leaving a first remaining portion of the epitaxial layer 1004 corresponding to the first semiconductive region 212 of FIG. 13 and a second remaining portion of the epitaxial layer 1004 of FIG. 12 corresponding to the second semiconductive region 214 of FIG. 13.

Figure 28:
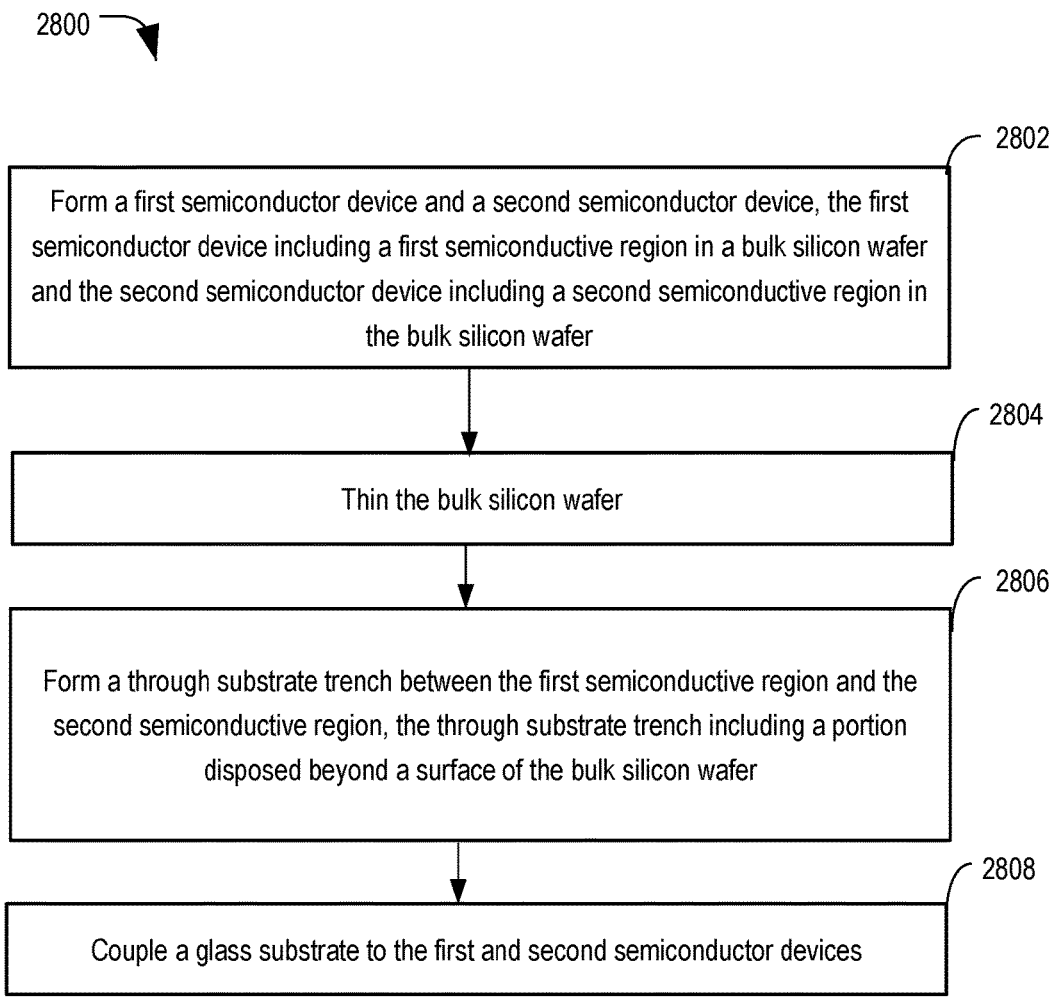
FIG. 28 is a flow chart of a particular illustrative example of a method of forming the IC of FIG. 3 or 4.

Referring to FIG. 28, a flow chart of an illustrative example of a method 2800 of fabricating an electronic device is depicted. The electronic device may include the IC 300 of FIG. 3 or the IC 400 of FIG. 4.

The method 2800 of FIG. 28 may include forming, at 2802, a first semiconductor device and a second semiconductor device. The first semiconductor device includes a first semiconductive region of a bulk silicon wafer, and the second semiconductor device includes a second semiconductive region of the bulk silicon wafer. The bulk silicon wafer may correspond to the bulk silicon wafer 1000 of FIG. 10. The first and second semiconductor devices may correspond to the first and second semiconductor devices 322 and 324 of FIG. 3 and may be formed as described above with reference to the first stage of FIG. 14. Alternatively, the first and second semiconductor devices may correspond to the first and second semiconductor devices 422 and 424 of FIG. 4 and may be formed as described above with reference to the first stage of FIG. 20.

The method 2800 of FIG. 28 may include thinning, at 2804, the bulk silicon wafer. For example, the method 2800 may include thinning the bulk silicon wafer 1000 of FIG. 10 as described above with reference to FIGS. 16 and 22.

The method 2800 of FIG. 28 may include forming, at 2806, a through substrate trench and coupling, at 2808, a glass substrate to the first and second semiconductor devices. The glass substrate may correspond to the glass substrate 302 of FIG. 3 or the glass substrate 402 of FIG. 4, and the through substrate trench may correspond to the through substrate trench 370 of FIG. 3 or the through substrate trench 470 of FIG. 4.

In some examples, the glass substrate may be coupled to the first and second semiconductor devices after forming the through substrate trench. For example, the through substrate trench 370 of FIG. 3 may be formed as described above with reference to the fourth and fifth stages of FIGS. 17 and 18, and the glass substrate 302 of FIG. 19 may be coupled to the first and second semiconductor devices 322 and 324 as described above with reference to the sixth stage of FIG. 19.

Alternatively, the glass substrate may be coupled to the first and second semiconductor devices before forming the through substrate trench. For example, the glass substrate 402 of FIG. 23 may be coupled to the first and second semiconductor devices 422 and 424 as described above with reference to the fourth stage of FIG. 23, and the through substrate trench 470 of FIG. 3 may be formed as described above with reference to the fifth and sixth stages of FIGS. 24 and 25.

Figure 29:
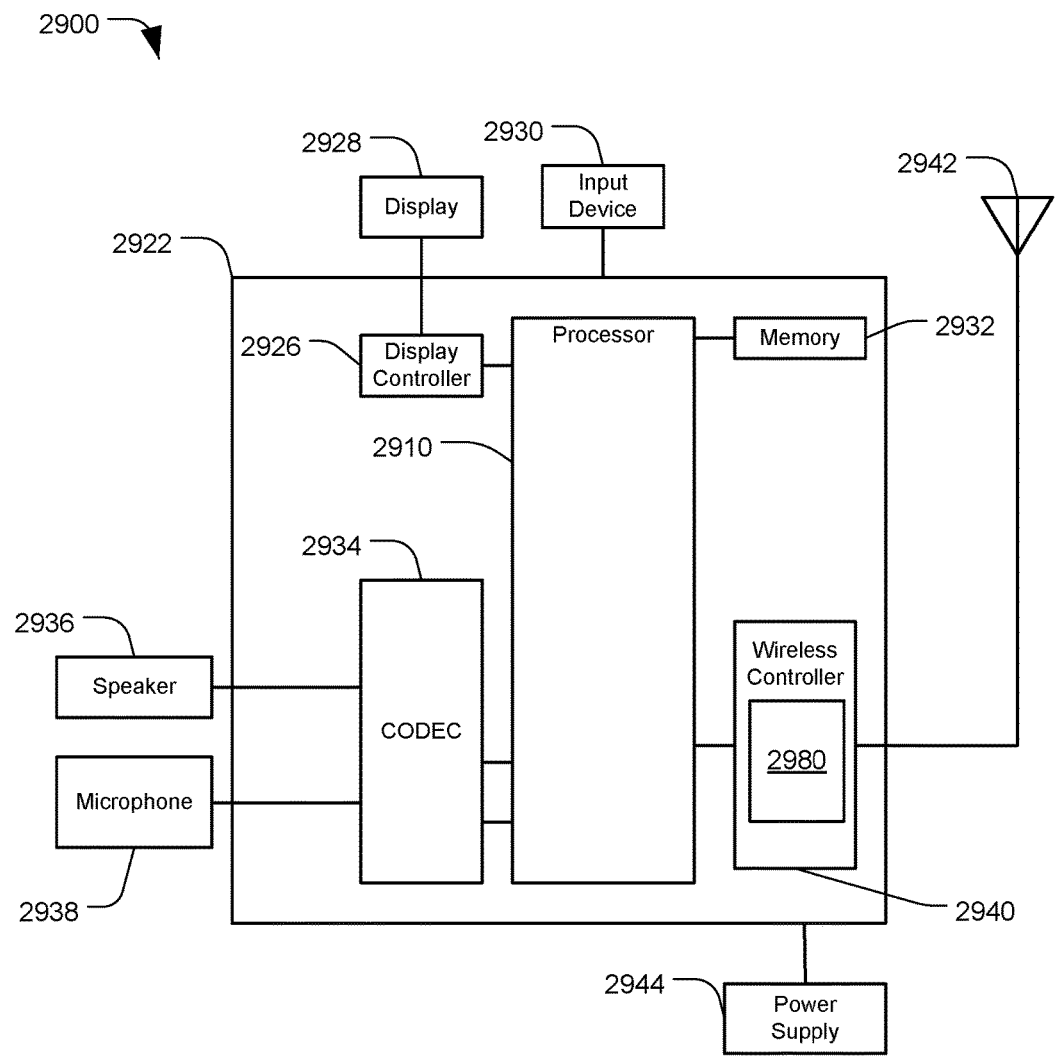
FIG. 29 is a block diagram of portable device including an IC on a glass substrate.

Referring to FIG. 29, a block diagram of a particular illustrative example of a wireless communication device is depicted and generally designated 2900. The wireless communication device 2900 includes a processor 2910, such as a digital signal processor (DSP), coupled to a memory 2932 (e.g., a random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of non-transient storage medium known in the art).

FIG. 29 also shows a display controller 2926 that is coupled to the processor 2910 and to a display 2928. A coder/decoder (CODEC) 2934 may also be coupled to the processor 2910. A speaker 2936 and a microphone 2938 may be coupled to the CODEC 2934.

FIG. 29 also indicates that a wireless controller 2940 may be coupled to the processor 2910 and may be further coupled to an antenna 2942. The wireless controller 2940 may include one or more ICs 2980, such as RF IC components (e.g., switches). The one or more ICs 2980 may include or may correspond to the IC 100 of FIG. 1, the IC 200 of FIG. 2, the IC 300 of FIG. 3, the IC 400 of FIG. 4, or a combination thereof. The one or more ICs 2980 may be configured to route RF signals as part of an antenna switch or a distribution switch.

In a particular implementation, the processor 2910, the display controller 2926, the memory 2932, the CODEC 2934, and the wireless controller 2940 are included in a system-in-package or system-on-chip device 2922. In a particular implementation, an input device 2930 and a power supply 2944 are coupled to the system-on-chip device 2922. Moreover, in a particular example, as illustrated in FIG. 29, the display 2928, the input device 2930, the speaker 2936, the microphone 2938, the antenna 2942, and the power supply 2944 are external to the system-on-chip device 2922. However, each of the display 2928, the input device 2930, the speaker 2936, the microphone 2938, the antenna 2942, and the power supply 2944 may be coupled to a component of the system-on-chip device 2922, such as an interface or a controller.

The foregoing disclosed devices and functionalities may be designed and configured into computer files (e.g. RTL, GDSII, GERBER, etc.) stored on computer readable media. Some or all such files may be provided to fabrication handlers who fabricate devices based on such files. Resulting products include semiconductor wafers that are then cut into semiconductor die and packaged into a semiconductor chip. The chips are then integrated into electronic devices, as described further with reference to FIG. 30.

Figure 30:
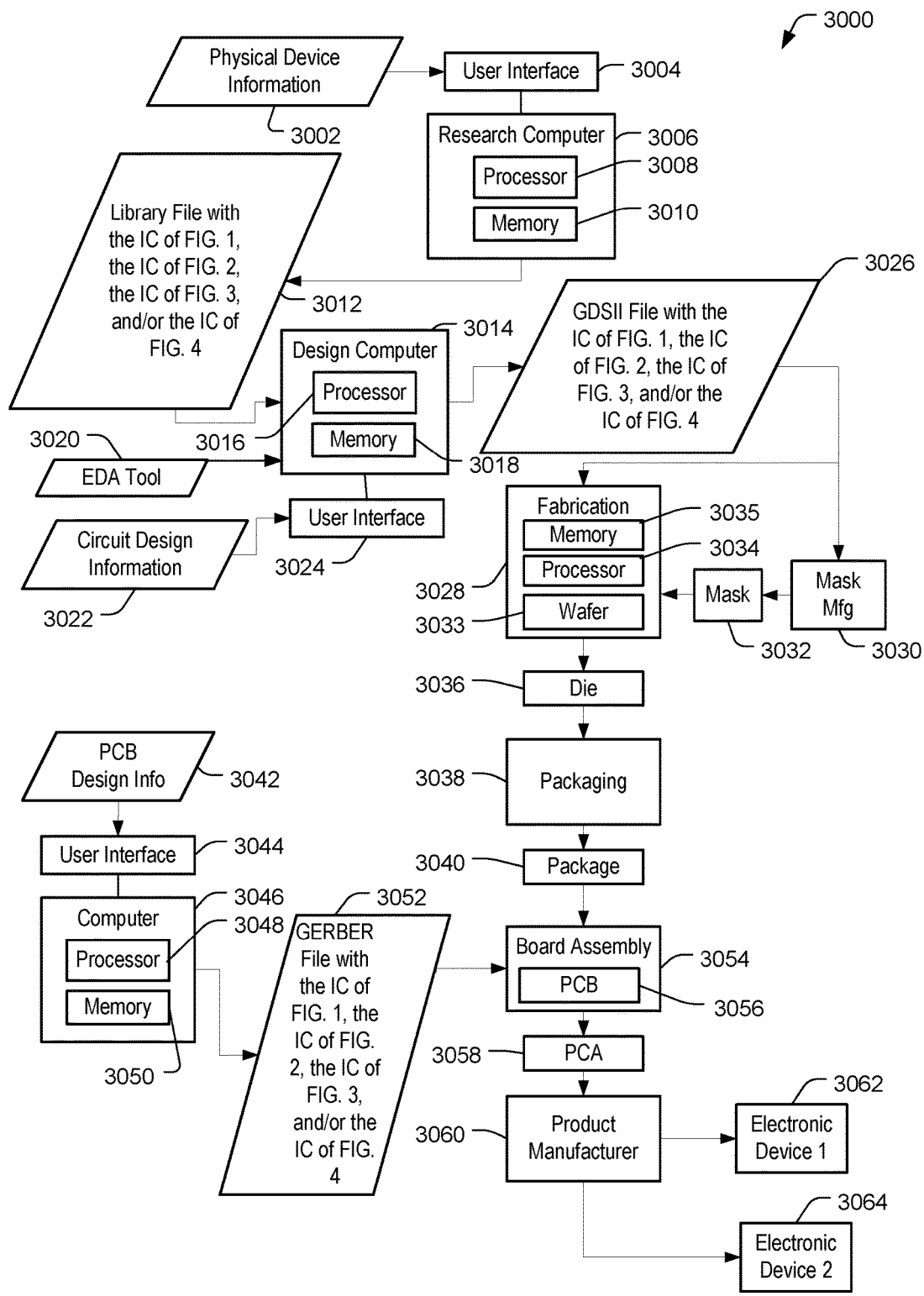
FIG. 30 is a data flow diagram of a particular illustrative example of a manufacturing process to manufacture electronic devices that include an IC on a glass substrate.

Referring to FIG. 30, a particular illustrative implementation of an electronic device manufacturing (e.g., fabricating) process is depicted and generally designated 3000. Physical device information 3002 is received at the manufacturing process 3000, such as at a research computer 3006. The physical device information 3002 may include design information representing at least one physical property of a semiconductor device, such as the glass substrate 102 and the first and second semiconductor devices 122 and 124 of FIG. 1; the glass substrate 202 and the first and second semiconductor devices 222 and 224 of FIG. 2; the glass substrate 302, the through substrate trench 370, and the first and second semiconductor devices 322 and 324 of FIG. 3; the glass substrate 402, the through substrate trench 470, and the first and second semiconductor devices 422 and 424 of FIG. 4, or any combination thereof. For example, the physical device information 3002 may include physical parameters, material characteristics, and structure information that is entered via a user interface 3004 coupled to the research computer 3006. The research computer 3006 includes a processor 3008, such as one or more processing cores, coupled to a computer readable medium (e.g., a non-transitory computer-readable storage medium), such as a memory 3010. The memory 3010 may store computer readable instructions that are executable to cause the processor 3008 to transform the physical device information 3002 to comply with a file format and to generate a library file 3012.

In a particular implementation, the library file 3012 includes at least one data file including the transformed design information. For example, the library file 3012 may include a library of semiconductor devices including a device that includes the glass substrate 102 and the first and second semiconductor devices 122 and 124 of FIG. 1; the glass substrate 202 and the first and second semiconductor devices 222 and 224 of FIG. 2; the glass substrate 302, the through substrate trench 370, and the first and second semiconductor devices 322 and 324 of FIG. 3; the glass substrate 402, the through substrate trench 470, and the first and second semiconductor devices 422 and 424 of FIG. 4, or any combination thereof, that is provided for use with an electronic design automation (EDA) tool 3020.

The library file 3012 may be used in conjunction with the EDA tool 3020 at a design computer 3014 including a processor 3016, such as one or more processing cores, coupled to a memory 3018. The EDA tool 3020 may be stored as processor executable instructions at the memory 3018 to enable a user of the design computer 3014 to design a circuit including the glass substrate 102 and the first and second semiconductor devices 122 and 124 of FIG. 1; the glass substrate 202 and the first and second semiconductor devices 222 and 224 of FIG. 2; the glass substrate 302, the through substrate trench 370, and the first and second semiconductor devices 322 and 324 of FIG. 3; the glass substrate 402, the through substrate trench 470, and the first and second semiconductor devices 422 and 424 of FIG. 4, or any combination thereof, of the library file 3012. For example, a user of the design computer 3014 may enter circuit design information 3022 via a user interface 3024 coupled to the design computer 3014. The circuit design information 3022 may include design information representing at least one physical property of a semiconductor device, such as the glass substrate 102 and the first and second semiconductor devices 122 and 124 of FIG. 1; the glass substrate 202 and the first and second semiconductor devices 222 and 224 of FIG. 2; the glass substrate 302, the through substrate trench 370, and the first and second semiconductor devices 322 and 324 of FIG. 3; the glass substrate 402, the through substrate trench 470, and the first and second semiconductor devices 422 and 424 of FIG. 4, or any combination thereof. To illustrate, the circuit design property may include identification of particular circuits and relationships to other elements in a circuit design, positioning information, feature size information, interconnection information, or other information representing a physical property of a semiconductor device.

The design computer 3014 may be configured to transform the design information, including the circuit design information 3022, to comply with a file format. To illustrate, the file format may include a database binary file format representing planar geometric shapes, text labels, and other information about a circuit layout in a hierarchical format, such as a Graphic Data System (GDSII) file format. The design computer 3014 may be configured to generate a data file including the transformed design information, such as a GDSII file 3026 that includes information describing the glass substrate 102 and the first and second semiconductor devices 122 and 124 of FIG. 1; the glass substrate 202 and the first and second semiconductor devices 222 and 224 of FIG. 2; the glass substrate 302, the through substrate trench 370, and the first and second semiconductor devices 322 and 324 of FIG. 3; the glass substrate 402, the through substrate trench 470, and the first and second semiconductor devices 422 and 424 of FIG. 4, or any combination thereof, in addition to other circuits or information. To illustrate, the data file may include information corresponding to a system-on-chip (SOC) that includes the glass substrate 102 and the first and second semiconductor devices 122 and 124 of FIG. 1; the glass substrate 202 and the first and second semiconductor devices 222 and 224 of FIG. 2; the glass substrate 302, the through substrate trench 370, and the first and second semiconductor devices 322 and 324 of FIG. 3; the glass substrate 402, the through substrate trench 470, and the first and second semiconductor devices 422 and 424 of FIG. 4, and that also includes additional electronic circuits and components within the SOC.

The GDSII file 3026 may be received at a fabrication process 3028 to fabricate the glass substrate 102 and the first and second semiconductor devices 122 and 124 of FIG. 1; the glass substrate 202 and the first and second semiconductor devices 222 and 224 of FIG. 2; the glass substrate 302, the through substrate trench 370, and the first and second semiconductor devices 322 and 324 of FIG. 3; the glass substrate 402, the through substrate trench 470, and the first and second semiconductor devices 422 and 424 of FIG. 4, or any combination thereof, according to transformed information in the GDSII file 3026. For example, a device manufacturing process may include providing the GDSII file 3026 to a mask manufacturer 3030 to create one or more masks, such as masks to be used with photolithography processing, illustrated as a representative mask 3032. The mask 3032 may be used during the fabrication process to generate one or more wafers 3033, which may be tested and separated into dies, such as a representative die 3036. The die 3036 includes a circuit including a device that includes the glass substrate 102 and the first and second semiconductor devices 122 and 124 of FIG. 1; the glass substrate 202 and the first and second semiconductor devices 222 and 224 of FIG. 2; the glass substrate 302, the through substrate trench 370, and the first and second semiconductor devices 322 and 324 of FIG. 3; the glass substrate 402, the through substrate trench 470, and the first and second semiconductor devices 422 and 424 of FIG. 4, or any combination thereof.

For example, the fabrication process 3028 may include a processor 3034 and a memory 3035 to initiate and/or control the fabrication process 3028. The memory 3035 may include executable instructions such as computer-readable instructions or processor-readable instructions. The executable instructions may include one or more instructions that are executable by a computer such as the processor 3034. In a particular example, the executable instructions may cause a computer to perform the method 2600 of FIG. 26 (or at least a portion thereof), the method 2700 of FIG. 27 (or at least a portion thereof), and/or the method 2800 of FIG. 28 (or at least a portion thereof).

The fabrication process 3028 may be implemented by a fabrication system that is fully automated or partially automated. For example, the fabrication process 3028 may be automated according to a schedule. The fabrication system may include fabrication equipment (e.g., processing tools) to perform one or more operations to form a semiconductor device. For example, the fabrication equipment may be configured to deposit one or more materials using chemical vapor deposition (CVD) and/or physical vapor deposition (PVD), pattern materials using a single-mask or multi-mask litho-etch process (e.g., two-mask LELE), pattern materials using a litho-freeze-litho-etch (LFLE) process, pattern materials using a self-aligned double patterning (SADP) process, epitaxially grow one or more materials, conformally deposit one or more materials, apply a hardmask, apply an etching mask, perform etching, perform planarization, form a dummy gate stack, form a gate stack, perform a standard clean 1 type, etc. In a particular example, the fabrication process 3028 corresponds to a semiconductor manufacturing process associated with a technology node smaller than 14 nm (e.g., 10 nm, 7 nm, etc.). The specific process or combination of processes used to manufacture a device (e.g., including the glass substrate 102 and the first and second semiconductor devices 122 and 124 of FIG. 1; the glass substrate 202 and the first and second semiconductor devices 222 and 224 of FIG. 2; the glass substrate 302, the through substrate trench 370, and the first and second semiconductor devices 322 and 324 of FIG. 3; the glass substrate 402, the through substrate trench 470, and the first and second semiconductor devices 422 and 424 of FIG. 4; or any combination thereof) may be based on design constraints and available materials/equipment. Thus, in particular implementations, different processes may be used than described with reference to FIGS. 1-30 during manufacture of the device.

The fabrication system (e.g., an automated system that performs the fabrication process 3028) may have a distributed architecture (e.g., a hierarchy). For example, the fabrication system may include one or more processors, such as the processor 3034, one or more memories, such as the memory 3035, and/or controllers that are distributed according to the distributed architecture. The distributed architecture may include a high-level processor that controls or initiates operations of one or more low-level systems. For example, a high-level portion of the fabrication process 3028 may include one or more processors, such as the processor 3034, and the low-level systems may each include or may be controlled by one or more corresponding controllers. A particular controller of a particular low-level system may receive one or more instructions (e.g., commands) from a particular high-level system, may issue sub-commands to subordinate modules or process tools, and may communicate status data back to the particular high-level. Each of the one or more low-level systems may be associated with one or more corresponding pieces of fabrication equipment (e.g., processing tools). In a particular implementation, the fabrication system may include multiple processors that are distributed in the fabrication system. For example, a controller of a low-level system component may include a processor, such as the processor 3034.

Alternatively, the processor 3034 may be a part of a high-level system, subsystem, or component of the fabrication system. In another implementation, the processor 3034 includes distributed processing at various levels and components of a fabrication system.

The executable instructions included in the memory 3035 may enable the processor 3034 to form (or initiate formation of) the glass substrate 102 and the first and second semiconductor devices 122 and 124 of FIG. 1; the glass substrate 202 and the first and second semiconductor devices 222 and 224 of FIG. 2; the glass substrate 302, the through substrate trench 370, and the first and second semiconductor devices 322 and 324 of FIG. 3; the glass substrate 402, the through substrate trench 470, and the first and second semiconductor devices 422 and 424 of FIG. 4; or any combination thereof. In a particular implementation, the memory 3035 is a non-transitory computer-readable medium storing computer-executable instructions that are executable by the processor 3034 to cause the processor 3034 to initiate formation of a device in accordance with at least a portion of the method 2600 of FIG. 26 (or at least a portion thereof), the method 2700 of FIG. 27 (or at least a portion thereof), and/or the method 2800 of FIG. 28 (or at least a portion thereof). For example, the computer executable instructions may be executable to cause the processor 3034 to initiate formation of the glass substrate 102 and the first and second semiconductor devices 122 and 124 of FIG. 1; the glass substrate 202 and the first and second semiconductor devices 222 and 224 of FIG. 2; the glass substrate 302, the through substrate trench 370, and the first and second semiconductor devices 322 and 324 of FIG. 3; the glass substrate 402, the through substrate trench 470, and the first and second semiconductor devices 422 and 424 of FIG. 4; or any combination thereof. As an illustrative example, the processor 3034 may initiate or control one or more steps of the method 2600 of FIG. 26 (or at least a portion thereof), the method 2700 of FIG. 27 (or at least a portion thereof), and/or the method 2800 of FIG. 28 (or at least a portion thereof).

The die 3036 may be provided to a packaging process 3038 where the die 3036 is incorporated into a representative package 3040. For example, the package 3040 may include the single die 3036 or multiple dies, such as a system-in-package (SiP) arrangement. The package 3040 may be configured to conform to one or more standards or specifications, such as Joint Electron Device Engineering Council (JEDEC) standards.

Information regarding the package 3040 may be distributed to various product designers, such as via a component library stored at a computer 3046. The computer 3046 may include a processor 3048, such as one or more processing cores, coupled to a memory 3050. A printed circuit board (PCB) tool may be stored as processor executable instructions at the memory 3050 to process PCB design information 3042 received from a user of the computer 3046 via a user interface 3044. The PCB design information 3042 may include physical positioning information of a packaged semiconductor device on a circuit board, the packaged semiconductor device corresponding to the package 3040 including the glass substrate 102 and the first and second semiconductor devices 122 and 124 of FIG. 1; the glass substrate 202 and the first and second semiconductor devices 222 and 224 of FIG. 2; the glass substrate 302, the through substrate trench 370, and the first and second semiconductor devices 322 and 324 of FIG. 3; the glass substrate 402, the through substrate trench 470, and the first and second semiconductor devices 422 and 424 of FIG. 4; or any combination thereof.

The computer 3046 may be configured to transform the PCB design information 3042 to generate a data file, such as a GERBER file 3052 with data that includes physical positioning information of a packaged semiconductor device on a circuit board, as well as layout of electrical connections such as traces and vias, where the packaged semiconductor device corresponds to the package 3040 including the glass substrate 102 and the first and second semiconductor devices 122 and 124 of FIG. 1; the glass substrate 202 and the first and second semiconductor devices 222 and 224 of FIG. 2; the glass substrate 302, the through substrate trench 370, and the first and second semiconductor devices 322 and 324 of FIG. 3; the glass substrate 402, the through substrate trench 470, and the first and second semiconductor devices 422 and 424 of FIG. 4; or any combination thereof. In other implementations, the data file generated by the transformed PCB design information may have a format other than a GERBER format.

The GERBER file 3052 may be received at a board assembly process 3054 and used to create PCBs, such as a representative PCB 3056, manufactured in accordance with the design information stored within the GERBER file 3052. For example, the GERBER file 3052 may be uploaded to one or more machines to perform various steps of a PCB production process. The PCB 3056 may be populated with electronic components including the package 3040 to form a representative printed circuit assembly (PCA) 3058.

The PCA 3058 may be received at a product manufacturing process 3060 and integrated into one or more electronic devices, such as a first representative electronic device 3062 and a second representative electronic device 3064. For example, the first representative electronic device 3062, the second representative electronic device 3064, or both, may include or correspond to the wireless communication device 2900 of FIG. 29. As an illustrative, non-limiting example, the first representative electronic device 3062, the second representative electronic device 3064, or both, may include a communications device, a fixed location data unit, a mobile location data unit, a mobile phone, a cellular phone, a satellite phone, a computer, a tablet, a portable computer, or a desktop computer. Alternatively or additionally, the first representative electronic device 3062, the second representative electronic device 3064, or both, may include a set top box, an entertainment unit, a navigation device, a personal digital assistant (PDA), a monitor, a computer monitor, a television, a tuner, a radio, a satellite radio, a music player, a digital music player, a portable music player, a video player, a digital video player, a digital video disc (DVD) player, a portable digital video player, any other device that stores or retrieves data or computer instructions, or a combination thereof, into which the into which the glass substrate 102 and the first and second semiconductor devices 122 and 124 of FIG. 1; the glass substrate 202 and the first and second semiconductor devices 222 and 224 of FIG. 2; the glass substrate 302, the through substrate trench 370, and the first and second semiconductor devices 322 and 324 of FIG. 3; the glass substrate 402, the through substrate trench 470, and the first and second semiconductor devices 422 and 424 of FIG. 4; or any combination thereof is integrated.

As another illustrative, non-limiting example, one or more of the electronic devices 3062 and 3064 may include remote units such as mobile phones, hand-held personal communication systems (PCS) units, portable data units such as personal data assistants, global positioning system (GPS) enabled devices, navigation devices, fixed location data units such as meter reading equipment, or any other device that stores or retrieves data or computer instructions, or any combination thereof. Although FIG. 30 illustrates remote units according to teachings of the disclosure, the disclosure is not limited to these illustrated units. Aspects, examples, and/or implementations of the disclosure may be suitably employed in any device which includes active integrated circuitry including memory and on-chip circuitry. For example, one or more of the electronic device 3062 and 3064 may include cars, trucks, airplanes, boats, other vehicles, or appliances, such as refrigerators, microwaves, washing machines, security systems, other appliances, or a combination thereof. In a particular implementation, one or more of the electronic device 3062 and 3064 may utilize memory and/or wireless communication.

A device that includes the glass substrate 102 and the first and second semiconductor devices 122 and 124 of FIG. 1; the glass substrate 202 and the first and second semiconductor devices 222 and 224 of FIG. 2; the glass substrate 302, the through substrate trench 370, and the first and second semiconductor devices 322 and 324 of FIG. 3; the glass substrate 402, the through substrate trench 470, and the first and second semiconductor devices 422 and 424 of FIG. 4; or any combination thereof, may be fabricated, processed, and incorporated into an electronic device, as described in the illustrative process 3000. One or more aspects of the implementations or examples disclosed with respect to FIGS. 1-30 may be included at various processing stages, such as within the library file 3012, the GDSII file 3026 (e.g., a file having a GDSII format), and the GERBER file 3052 (e.g., a file having a GERBER format), as well as stored at the memory 3010 of the research computer 3006, the memory 3018 of the design computer 3014, the memory 3050 of the computer 3046, the memory of one or more other computers or processors (not shown) used at the various stages, such as at the board assembly process 3054, and also incorporated into one or more other physical implementations such as the mask 3032, the die 3036, the package 3040, the PCA 3058, other products such as prototype circuits or devices (not shown), or any combination thereof. Although various representative stages of production from a physical device design to a final product are depicted, in other implementations fewer stages may be used or additional stages may be included. Similarly, the process 3000 may be performed by a single entity or by one or more entities performing various stages of the process 3000.

Although one or more of FIGS. 1-30 may illustrate systems, devices, and/or methods according to the teachings of the disclosure, the disclosure is not limited to these illustrated systems, devices, and/or methods. Aspects, examples, and/or implementations of the disclosure may be suitably employed in any device that includes integrated circuitry including memory, a processor, and on-chip circuitry.

One or more functions or components of any of FIGS. 1-30 as illustrated or described herein may be combined with one or more other portions of another of FIGS. 1-30. Accordingly, no single aspect, example, and/or implementation described herein should be construed as limiting and aspects, examples, and/or implementations of the disclosure may be suitably combined without departing form the teachings of the disclosure.

Those of skill would further appreciate that the various illustrative logical blocks, configurations, modules, circuits, and algorithm steps described in connection with the aspects, examples, and/or implementations disclosed herein may be implemented as electronic hardware, computer software executed by a processor, or combinations of both. Various illustrative components, blocks, configurations, modules, circuits, and steps have been described above generally in terms of their functionality. Whether such functionality is implemented as hardware or processor executable instructions depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the aspects, examples, and/or implementations disclosed herein may be embodied directly in hardware, in a software module executed by a processor, or in a combination of the two. A software module may reside in random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of non-transient storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal. A storage device is not a signal.

The previous description of the disclosed aspects, examples, and/or implementations is provided to enable a person skilled in the art to make or use the disclosed aspects, examples, and/or implementations. Various modifications to these aspects, examples, and/or implementations will be readily apparent to those skilled in the art, and the principles defined herein may be applied to other aspects, examples, and/or implementations without departing from the scope of the disclosure. Thus, the present disclosure is not intended to be limited to the aspects, examples, and/or implementations shown herein but is to be accorded the widest scope possible consistent with the principles and novel features as defined by the following claims.

What is claimed is:

1. An integrated circuit comprising:
   a glass substrate;
   a buried oxide layer;
   a first semiconductor device coupled to the glass substrate, the first semiconductor device including a first gate and a first portion of a semiconductive layer coupled to the buried oxide layer, wherein the first gate is located between the glass substrate and the first portion of the semiconductive layer and between the glass substrate and the buried oxide layer, wherein a first source region and a first drain region of the first semiconductor device are spaced from the buried oxide layer;
   a second semiconductor device coupled to the glass substrate, the second semiconductor device including a second gate and a second portion of the semiconductive layer, wherein the second gate is located between the glass substrate and the second portion of the semiconductive layer, and wherein the first portion of the semiconductive layer is discontinuous from the second portion of the semiconductive layer; and
   a contact in direct contact with the first portion of the semiconductive layer, wherein the first gate is located between the glass substrate and the contact.

2. The integrated circuit of claim 1, further comprising a second contact coupled to the first portion of the semiconductive layer and located between the glass substrate and the first portion of the semiconductive layer.

3. The integrated circuit of claim 2, further comprising an interconnect coupled via the second contact to the first portion of the semiconductive layer and including a portion located between the glass substrate and the first portion of the semiconductive layer.

4. The integrated circuit of claim 3, further comprising a third contact coupled to the interconnect and extending through the buried oxide layer.

5. The integrated circuit of claim 1, wherein the first and second semiconductor devices correspond to a complementary pair of metal-oxide semiconductor field effect transistors (MOSFETs) of a complementary metal oxide semiconductor (CMOS) device.

6. The integrated circuit of claim 1, wherein the second gate is located between the glass substrate and the buried oxide layer.

7. The integrated circuit of claim 1, wherein the first and second semiconductor devices form at least a portion of a radio frequency component.

8. The integrated circuit of claim 1, wherein the first portion of a semiconductive layer is disposed between the buried oxide layer and the first source region of the first semiconductor device.

9. The integrated circuit of claim 1, wherein a second source region and a second drain region of the second semiconductor device are spaced from the buried oxide layer.

\* \* \* \* \*